US012665026B2

(12) United States Patent
Ikegami

(10) Patent No.: US 12,665,026 B2
(45) Date of Patent: Jun. 23, 2026

(54) SEMICONDUCTOR MEMORY DEVICE PERFORMING MULTI-BIT PROGRAMMING USING SEQUENTIAL WRITE OPERATIONS WITH REDUCED LATCH COUNT

(71) Applicant: Kioxia Corporation, Tokyo (JP)

(72) Inventor: Kazutaka Ikegami, Inagi (JP)

(73) Assignee: Kioxia Corporation, Tokyo (JP)

( * ) Notice: Subject to any disclaimer, the term of this patent is extended or adjusted under 35 U.S.C. 154(b) by 22 days.

(21) Appl. No.: 18/593,570

(22) Filed: Mar. 1, 2024

(65) Prior Publication Data

US 2024/0304245 A1 Sep. 12, 2024

(30) Foreign Application Priority Data

Mar. 10, 2023 (JP) ................................. 2023-037553

(51) Int. Cl.
*G11C 16/10* (2006.01)
*G11C 16/04* (2006.01)
(Continued)

(52) U.S. Cl.
CPC .......... *G11C 16/0483* (2013.01); *G11C 16/10* (2013.01); *G11C 16/26* (2013.01); *G11C 16/3459* (2013.01)

(58) Field of Classification Search
CPC ..... G11C 16/0483; G11C 16/10; G11C 16/26; G11C 16/3459; G11C 11/5628; G11C 11/5642
See application file for complete search history.

(56) References Cited

U.S. PATENT DOCUMENTS 5,920,507 A * 7/1999 Takeuchi ............ G11C 11/5621
365/185.03
9,990,998 B2 * 6/2018 Shikata .............. G11C 16/3459
(Continued)

FOREIGN PATENT DOCUMENTS

JP 2018041523 A 3/2018
JP 2019050071 A 3/2019
(Continued)

OTHER PUBLICATIONS

H. Tanaka et al., "Toward 7 Bits per Cell: Synergistic Improvement of 3D Flash Memory by Combination of Single-crystal Channel and Cryogenic Operation", 2022 IEEE International Memory Workshop (IMW), Dresden, Germany, May 15-18, 2022, 4 pages.

*Primary Examiner* — Khamdan N. Alrobaie
(74) *Attorney, Agent, or Firm* — Kim & Stewart LLP

(57) ABSTRACT

A semiconductor memory device includes bit lines, memory cells that are respectively connected to the bit lines, sense amplifier units that are respectively connected to the bit lines, and each of which includes m latch circuits, and a logic control circuit configured to input data to the m latch circuits and control a write operation on each of the memory cells using the data input to the m latch circuits. The logic control circuit executes an operation to write n bits to each of the memory cells, where n is 2 or more and greater than m, by executing a plurality of write operations, including a first write operation executed on the memory cells by inputting first m bits of data to the m latch circuits, and a second write operation executed on the memory cells by inputting second m bits of data to the m latch circuits.

11 Claims, 26 Drawing Sheets

(51) Int. Cl.
  *G11C 16/26* (2006.01)
  *G11C 16/34* (2006.01)

(56) References Cited

U.S. PATENT DOCUMENTS

| | | | | |
|---|---|---|---|---|
| 2005/0047240 A1* | 3/2005 | Ikehashi | ............. | G11C 11/4091 |
| | | | | 365/222 |
| 2014/0082266 A1* | 3/2014 | Fujiu | .................. | G11C 16/3454 |
| | | | | 711/103 |
| 2018/0068727 A1* | 3/2018 | Harada | .................. | G11C 16/10 |
| 2018/0240515 A1* | 8/2018 | Shibata | ............. | G11C 16/3459 |
| 2019/0080763 A1* | 3/2019 | Kajiyama | ............... | G11C 16/10 |
| 2019/0088342 A1* | 3/2019 | Shimura | ................ | G11C 16/16 |
| 2019/0115070 A1* | 4/2019 | Harada | .............. | G11C 11/5628 |
| 2020/0090741 A1 | 3/2020 | Suzuki | | |
| 2021/0151099 A1* | 5/2021 | Shibata | .................. | G11C 16/30 |
| 2022/0076764 A1 | 3/2022 | Ohnishi | | |
| 2022/0301627 A1 | 9/2022 | Date | | |

FOREIGN PATENT DOCUMENTS

| | | | |
|---|---|---|---|
| JP | 2020047329 A | 3/2020 | |
| JP | 2022045789 A | 3/2022 | |
| JP | 2022144309 A | 10/2022 | |

* cited by examiner

| | S00 | S01 | S02 | S03 | S04 | S05 | S06 | S07 | S08 | S09 | S10 | S11 | S12 | S13 | S14 | S15 | S16 | S17 | S18 | S19 | S20 | S21 | S22 | S23 | S24 | S25 | S26 | S27 | S28 | S29 | S30 | S31 |
|---|---|---|---|---|---|---|---|---|---|---|---|---|---|---|---|---|---|---|---|---|---|---|---|---|---|---|---|---|---|---|---|---|
| 1st Page | 1 | 0 | 0 | 1 | 1 | 0 | 0 | 0 | 0 | 0 | 0 | 0 | 0 | 0 | 1 | 1 | 0 | 0 | 0 | 0 | 0 | 1 | 1 | 1 | 1 | 1 | 1 | 1 | 1 | 1 | 1 | 1 |
| 2nd Page | 1 | 1 | 0 | 0 | 0 | 0 | 0 | 0 | 0 | 0 | 1 | 1 | 1 | 0 | 0 | 0 | 0 | 1 | 1 | 1 | 1 | 1 | 1 | 0 | 0 | 0 | 0 | 1 | 1 | 1 | 1 | 1 |
| 3rd Page | 1 | 1 | 1 | 0 | 0 | 0 | 0 | 1 | 1 | 0 | 1 | 1 | 1 | 1 | 1 | 0 | 0 | 0 | 0 | 0 | 0 | 0 | 0 | 0 | 1 | 1 | 0 | 0 | 0 | 1 | 1 | 1 |
| 4th Page | 1 | 1 | 1 | 1 | 1 | 1 | 0 | 0 | 1 | 0 | 0 | 0 | 1 | 1 | 1 | 1 | 1 | 0 | 0 | 1 | 1 | 1 | 0 | 0 | 0 | 0 | 0 | 0 | 1 | 1 | 0 | 0 |
| 5th Page | 1 | 1 | 1 | 1 | 1 | 1 | 1 | 0 | 1 | 1 | 1 | 0 | 0 | 0 | 0 | 0 | 0 | 0 | 0 | 1 | 1 | 1 | 1 | 1 | 1 | 0 | 0 | 0 | 0 | 0 | 0 | 1 |

FIG. 10
SELECTED SU
OF SELECTED BLK
VREAD (8V)
WL_usel
SGD_sel,SGS
VSG(5V)
WL_sel
Vr
1V
BL
VSS(0V)
NON-SELECTED SU
OF SELECTED BLK
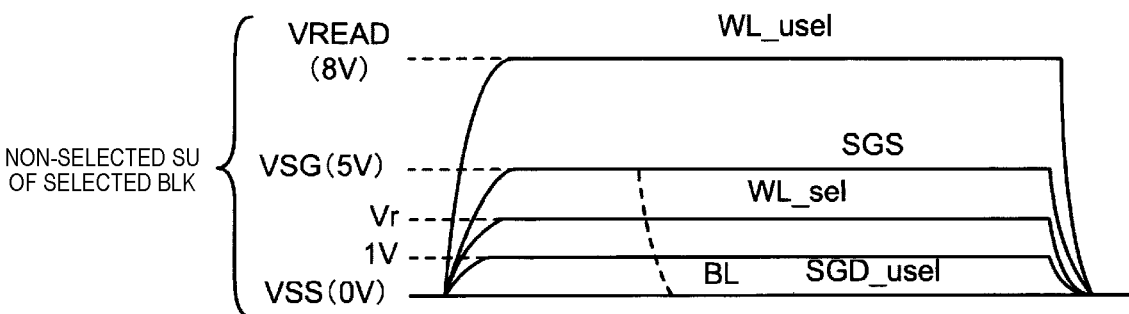
VREAD (8V)
WL_usel
SGS
VSG(5V)
WL_sel
Vr
1V
VSS(0V)
BL   SGD_usel
NON-SELECTED
BLK
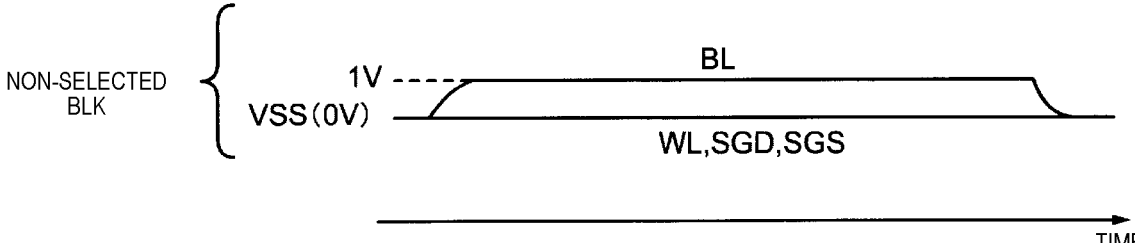
1V
BL
VSS(0V)
WL,SGD,SGS
TIME

FIG. 11

| THE NUMBER OF PROGRAM LOOPS / VERIFY TARGET STATE | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" STATE (VfyA) | O | O | O | O | O | O | | | | | | | | | | | | | |
| "B" STATE (VfyB) | | | O | O | O | O | O | O | | | | | | | | | | | |
| "C" STATE (VfyC) | | | | | O | O | O | O | O | O | | | | | | | | | |
| "D" STATE (VfyD) | | | | | | | O | O | O | O | O | O | | | | | | | |
| "E" STATE (VfyE) | | | | | | | | | O | O | O | O | O | O | | | | | |
| "F" STATE (VfyF) | | | | | | | | | | | O | O | O | O | O | O | | | |
| "G" STATE (VfyG) | | | | | | | | | | | | | | O | O | O | O | O | O |

FIG. 14A

|     | Er | A | B | C | D | E | F | G |
|-----|----|----|---|---|---|---|---|---|
| ADL | 1  | 0 | 0 | 0 | 0 | 1 | 1 | 1 |
| BDL | 1  | 1 | 0 | 0 | 1 | 1 | 0 | 0 |
| CDL | 1  | 1 | 1 | 0 | 0 | 0 | 0 | 1 |
| SDL | 0  | 1 | 0 | 0 | 0 | 0 | 0 | 0 |
| SEN | x  | x | x | x | x | x | x | x |

3bit/cell
8Level

FIG. 14B

|     | Er | A | B | C | D | E | F | G |
|-----|----|------|-----|-----|-----|-----|-----|-----|
| ADL | 1  | 1/0 | 0 | 0 | 0 | 1 | 1 | 1 |
| BDL | 1  | 1 | 0 | 0 | 1 | 1 | 0 | 0 |
| CDL | 1  | 1 | 1 | 0 | 0 | 0 | 0 | 1 |
| SDL | 0  | 1 | 0 | 0 | 0 | 0 | 0 | 0 |
| SEN | 0  | 1/0 | 1/0 | 1/0 | 1/0 | 1/0 | 1/0 | 1/0 |

SEN=1 (Vth>VfyA)
SEN=0 (Vth<VfyA)

FIG. 14C

|     | Er | A | B | C | D | E | F | G |
|-----|----|----|-----|-----|-----|-----|-----|-----|
| ADL | 1  | 1 | 0 | 0 | 0 | 1 | 1 | 1 |
| BDL | 1  | 1 | 0 | 0 | 1 | 1 | 0 | 0 |
| CDL | 1  | 1 | 1 | 0 | 0 | 0 | 0 | 1 |
| SDL | 0  | 1 | 0 | 0 | 0 | 0 | 0 | 0 |
| SEN | 0  | 1 | 1/0 | 1/0 | 1/0 | 1/0 | 1/0 | 1/0 |

Encoded Data

| Sub Coding | Page | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|---|
| 1st sub coding (1st sc) | 1st Page | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | 2nd Page | 1 | 0 | 0 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| | 3rd Page | 1 | 1 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 2nd sub coding (2nd sc) | 1st Page | − | − | − | − | − | − | − | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
| | 2nd Page | − | − | − | − | − | − | − | 1 | 0 | 0 | 1 | 1 | 1 | 0 | 0 | 0 | 0 | 0 | 0 | 0 | 0 | 0 | 0 | 0 | 0 | 0 | 0 | 0 | 0 | 0 | 0 | 0 |
| | 3rd Page | − | − | − | − | − | − | − | 1 | 1 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 0 |
| 3rd sub coding (3rd sc) | 1st Page | − | − | − | − | − | − | − | − | − | − | − | − | − | − | 1 | 1 | 1 | 1 | 0 | 0 | 0 | 0 | 0 | 0 | 0 | 0 | 0 | 0 | 0 | 0 | 0 | 0 |
| | 2nd Page | − | − | − | − | − | − | − | − | − | − | − | − | − | − | 1 | 0 | 0 | 1 | 1 | 1 | 0 | 0 | 0 | 0 | 0 | 0 | 0 | 0 | 0 | 0 | 0 | 0 |
| | 3rd Page | − | − | − | − | − | − | − | − | − | − | − | − | − | − | 1 | 1 | 0 | 0 | 0 | 1 | 1 | 0 | 0 | 0 | 0 | 0 | 0 | 0 | 0 | 0 | 0 | 0 |
| 4th sub coding (4th sc) | 1st Page | − | − | − | − | − | − | − | − | − | − | − | − | − | − | − | − | − | − | − | − | − | 1 | 1 | 1 | 1 | 0 | 0 | 0 | 0 | 0 | 0 | 0 |
| | 2nd Page | − | − | − | − | − | − | − | − | − | − | − | − | − | − | − | − | − | − | − | − | − | 1 | 0 | 0 | 1 | 1 | 1 | 0 | 0 | 0 | 0 | 0 |
| | 3rd Page | − | − | − | − | − | − | − | − | − | − | − | − | − | − | − | − | − | − | − | − | − | 1 | 1 | 0 | 0 | 0 | 1 | 1 | 0 | 0 | 0 | 0 |
| 5th sub coding (5th sc) | 1st Page | − | − | − | − | − | − | − | − | − | − | − | − | − | − | − | − | − | − | − | − | − | − | − | − | − | − | − | − | 1 | 1 | 1 | 1 |
| | 2nd Page | − | − | − | − | − | − | − | − | − | − | − | − | − | − | − | − | − | − | − | − | − | − | − | − | − | − | − | − | 1 | 0 | 0 | 1 |
| | 3rd Page | − | − | − | − | − | − | − | − | − | − | − | − | − | − | − | − | − | − | − | − | − | − | − | − | − | − | − | − | 1 | 1 | 0 | 0 |

UNWRITTEN

INTERMEDIATE STATE

INTERMEDIATE STATE

INTERMEDIATE STATE

INTERMEDIATE STATE

WRITTEN

Encoded Data

| Sub Coding | Page | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|---|
| 1st sub coding (1st sc) | 1st Page | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 2nd Page | 1 | 0 | 0 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 3rd Page | 1 | 1 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 2nd sub coding (2nd sc) | 1st Page |  |  |  |  |  | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 2nd Page |  |  |  |  |  | 1 | 0 | 0 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 |
|  | 3rd Page |  |  |  |  |  | 1 | 1 | 0 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 |

OVERLAPPING STATE

*FIG. 26*

SEMICONDUCTOR MEMORY DEVICE PERFORMING MULTI-BIT PROGRAMMING USING SEQUENTIAL WRITE OPERATIONS WITH REDUCED LATCH COUNT

CROSS-REFERENCE TO RELATED APPLICATION(S)

This application is based upon and claims the benefit of priority from Japanese Patent Application No. 2023-037553, filed Mar. 10, 2023, the entire contents of which are incorporated herein by reference.

FIELD

Embodiments described herein relate generally to a semiconductor memory device.

BACKGROUND

A NAND flash memory is known as one type of non-volatile semiconductor memory device.

DESCRIPTION OF THE DRAWINGS

FIG. 1 is a block diagram showing configurations of a memory system including a semiconductor memory device and a host, according to a first embodiment.

FIG. 6 is a diagram showing an example of assignment of data to different threshold voltage states of the memory cell transistor in the first embodiment.

FIG. 8 is a timing chart showing potential changes of each wiring line during a write operation of the memory system according to the first embodiment.

FIG. 10 is a timing chart showing potential changes of each wiring line during a verify operation of the memory system according to the first embodiment.

FIG. 11 is a diagram showing a relationship between the number of program loops, and the program operation and the verify operation in the write operation of the memory system according to the first embodiment.

FIG. 14A is a diagram showing an example of an operation of the sense amplifier unit in the first embodiment.

FIG. 14B is a diagram showing an example of the operation of the sense amplifier unit in the first embodiment.

FIG. 14C is a diagram showing an example of the operation of the sense amplifier unit in the first embodiment.

Figure 15:
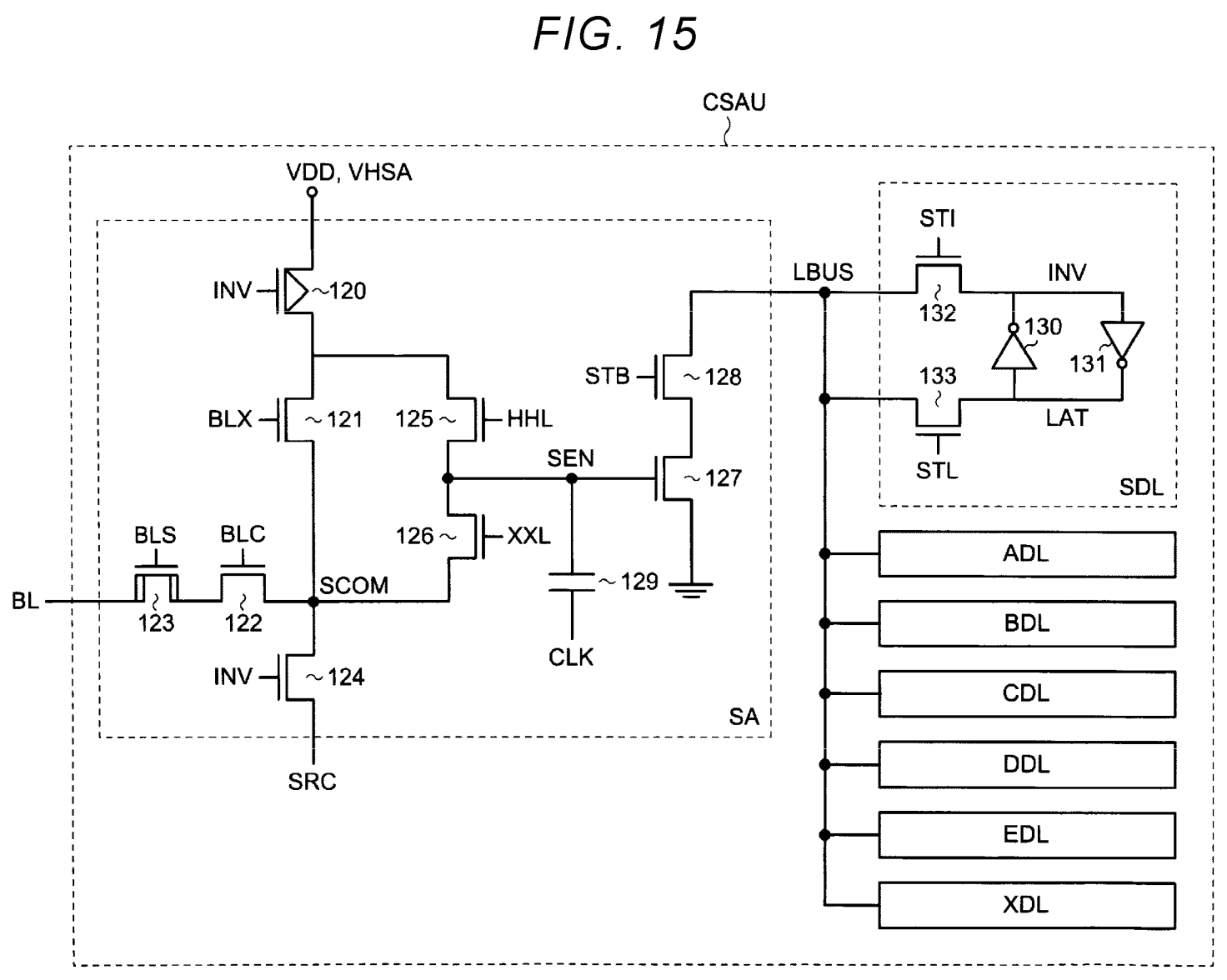

FIG. 15 is a circuit diagram showing an example of a circuit configuration of a sense amplifier unit in a comparative example.

Figure 18:
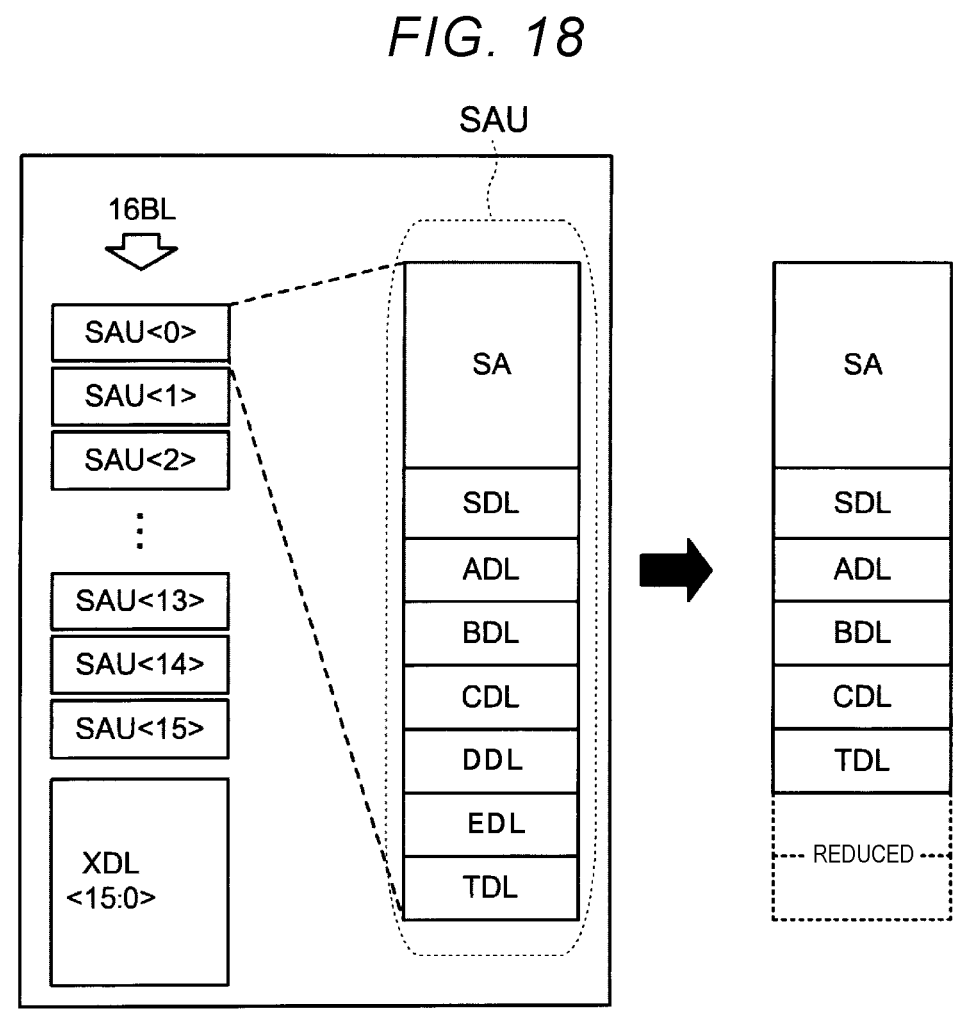

FIG. 18 is a schematic diagram showing a layout of the sense amplifier unit in the first embodiment.

Figure 20:
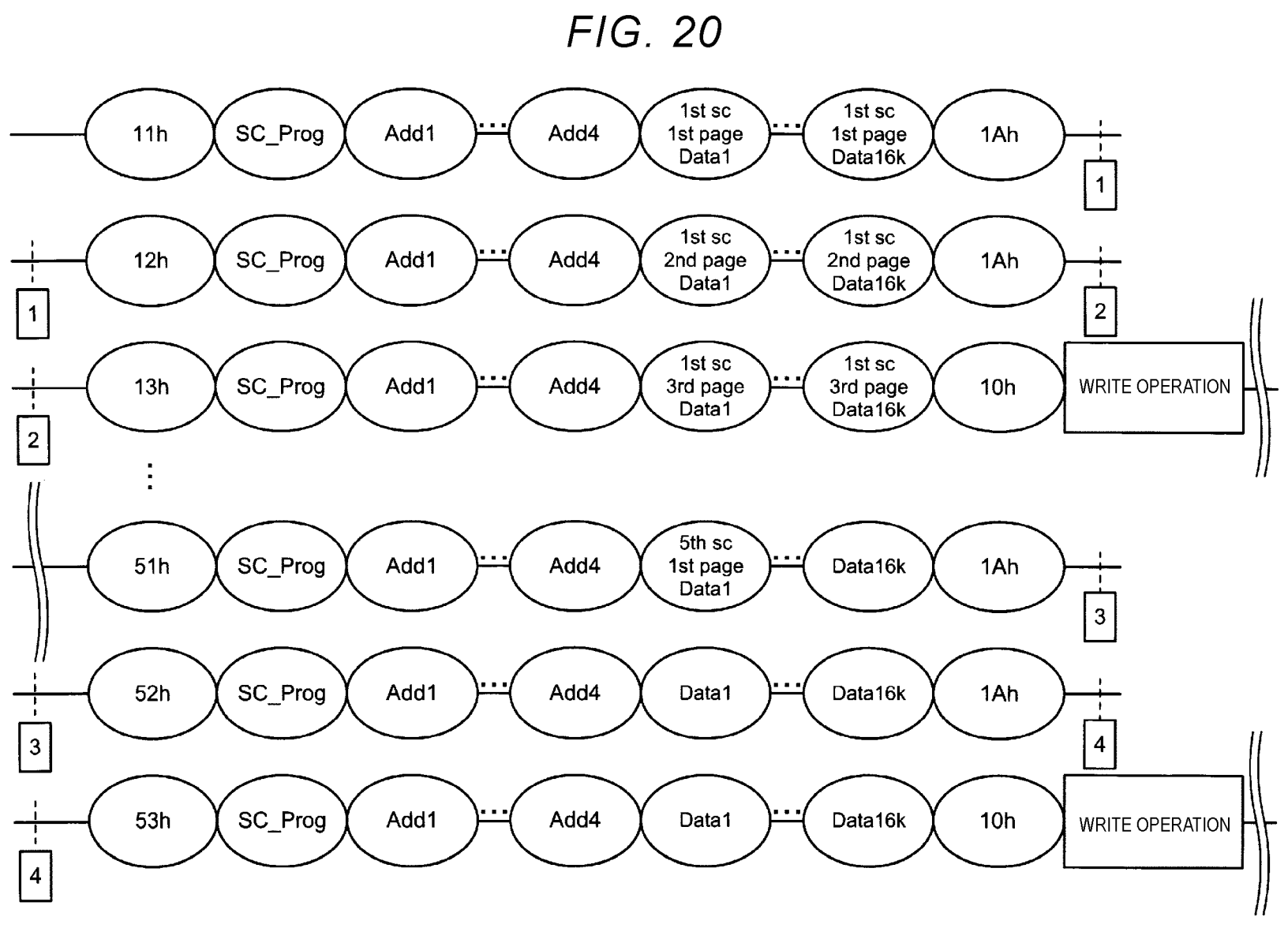

FIG. 20 is a diagram showing timings of the program operation and the verify operation in the subprogram sequence of the memory system according to the first embodiment.

Figure 22:
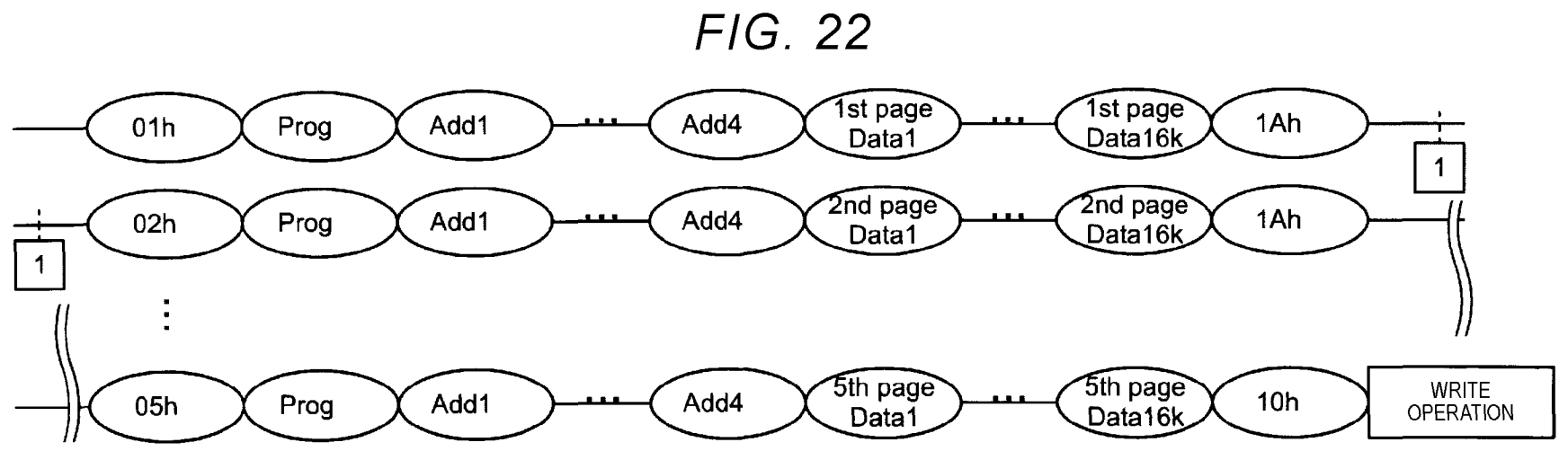

FIG. 22 is a diagram showing an example of a program sequence of a memory system according to a comparative example.

FIG. 23 is a diagram showing an example of an encoded data table of the memory system according to the first embodiment.

Figure 24:
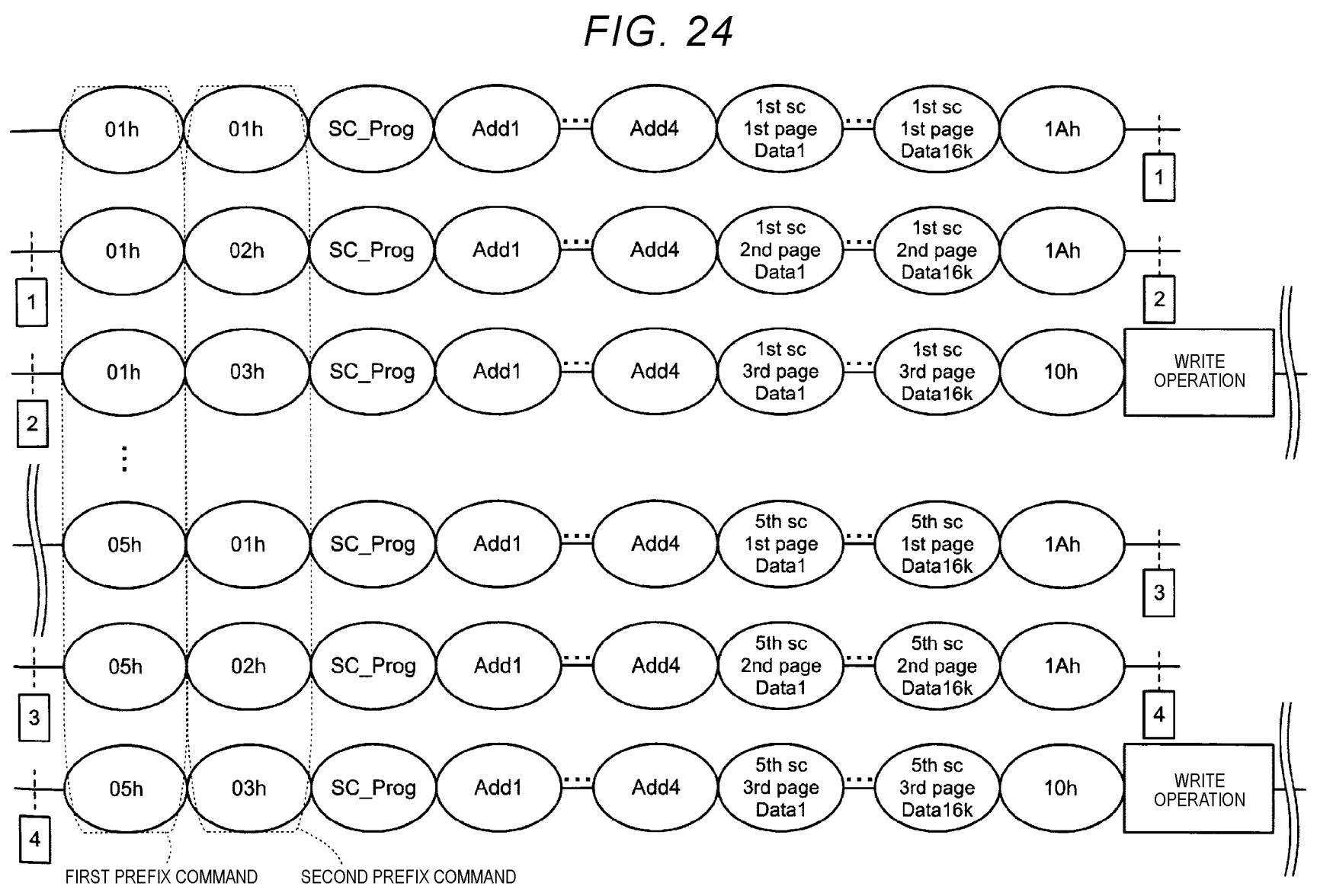

FIG. 24 is a diagram showing an example of the subprogram sequence of the memory system according to the first embodiment.

FIG. 25 is a diagram showing an example of encoded data of a memory system according to a second embodiment.

FIG. 26 is a diagram showing an example of a subprogram sequence of a memory system according to a third embodiment.

DETAILED DESCRIPTION

Figure 2:
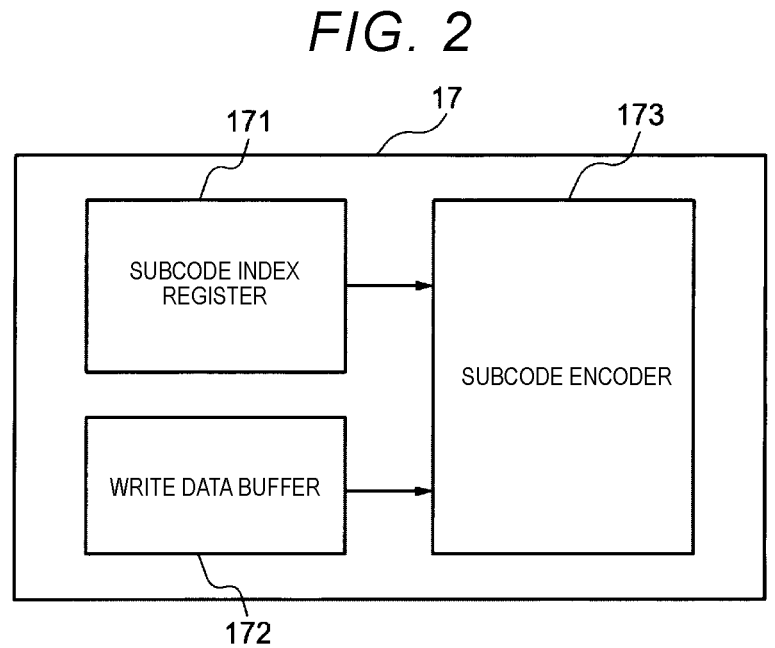
FIG. 2 is a block diagram showing a configuration of a subcode generator in the first embodiment.

Embodiments provide a semiconductor memory device capable of reducing the required number of latch circuits in a sense amplifier unit.

In general, according to one embodiment, a semiconductor memory device includes: i bit lines; i memory cells that are respectively and electrically connected to the i bit lines; a word line commonly connected to gates of the i memory cells; sense amplifier units that are respectively and electrically connected to the i bit lines, and each of which includes m latch circuits; and a logic control circuit configured to input data to the m latch circuits and control a write operation including a program operation and a verify operation on each of the i memory cells using the data input to the m latch circuits. The logic control circuit executes an operation to write n bits to each of the i memory cells by executing the write operation x times, where n is 2 or more and greater than m and x is 2 or more, and the x write operations include a first write operation executed by inputting first m bits of data to the m latch circuits, and a second write operation executed after the first write operation and by inputting second m bits of data different from the first m bits of data to the m latch circuits.

Hereinafter, embodiments will be described with reference to the drawings. In the following description, elements having the same or similar function and configuration are designated by a common reference numeral. In a case where a plurality of elements having the common reference numeral are to be distinguished from each other, the elements are distinguished by adding a subscript (for example, an uppercase letter of the alphabet, a lowercase letter of the alphabet, a number, or a hyphen and an uppercase letter with a number, or the like).

In the following description, the signal X<p:0> (p is a natural number) is a (p+1)-bit signal, which means a set of signals X<0>, X<1>, . . . , and X<p>, each of which is a 1-bit signal. The element Y<p:0> means a set of elements Y<0>, Y<1>, . . . , and Y<p> that correspond one-to-one to the input or output of the signal X<p:0>.

First Embodiment

Hereinafter, a memory system 3 according to the first embodiment will be described.

1-1. Configuration Example

1-1-1. Memory System 3 and Host 4

Figure 1:
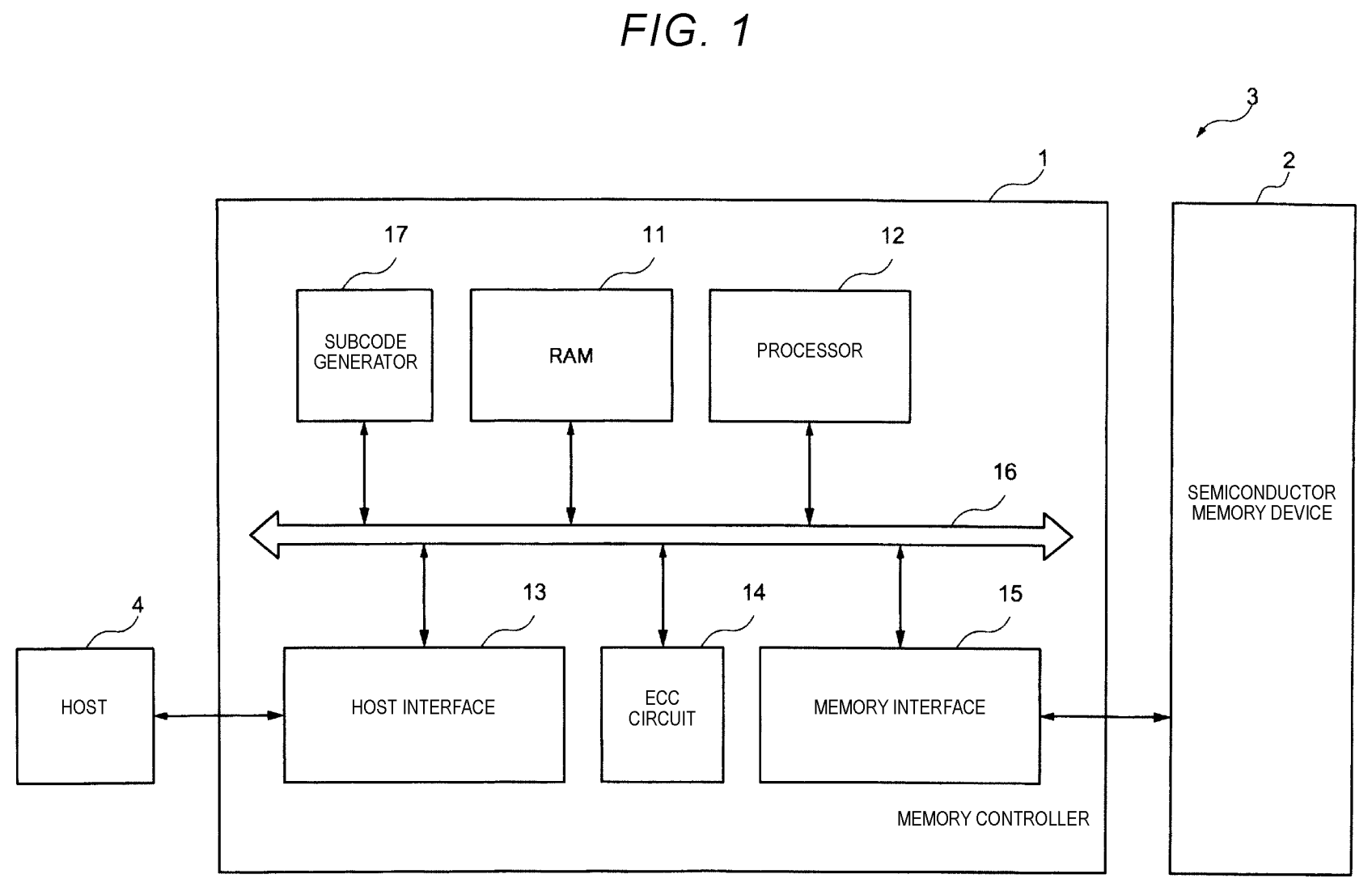

An overview of the memory system 3 and a host 4 will be described with reference to FIG. 1. FIG. 1 is a block diagram showing a configuration example of the memory system 3 and the host 4. The memory system 3 includes a memory controller 1 and a semiconductor memory device 2. The memory system 3 can be connected to the host 4. The memory system 3 is, for example, a memory card such as a solid state drive (SSD) or an SD® card. The host 4 is, for example, an electronic device such as a personal computer or a mobile terminal. The memory system 3 may include the host 4.

Figure 4:
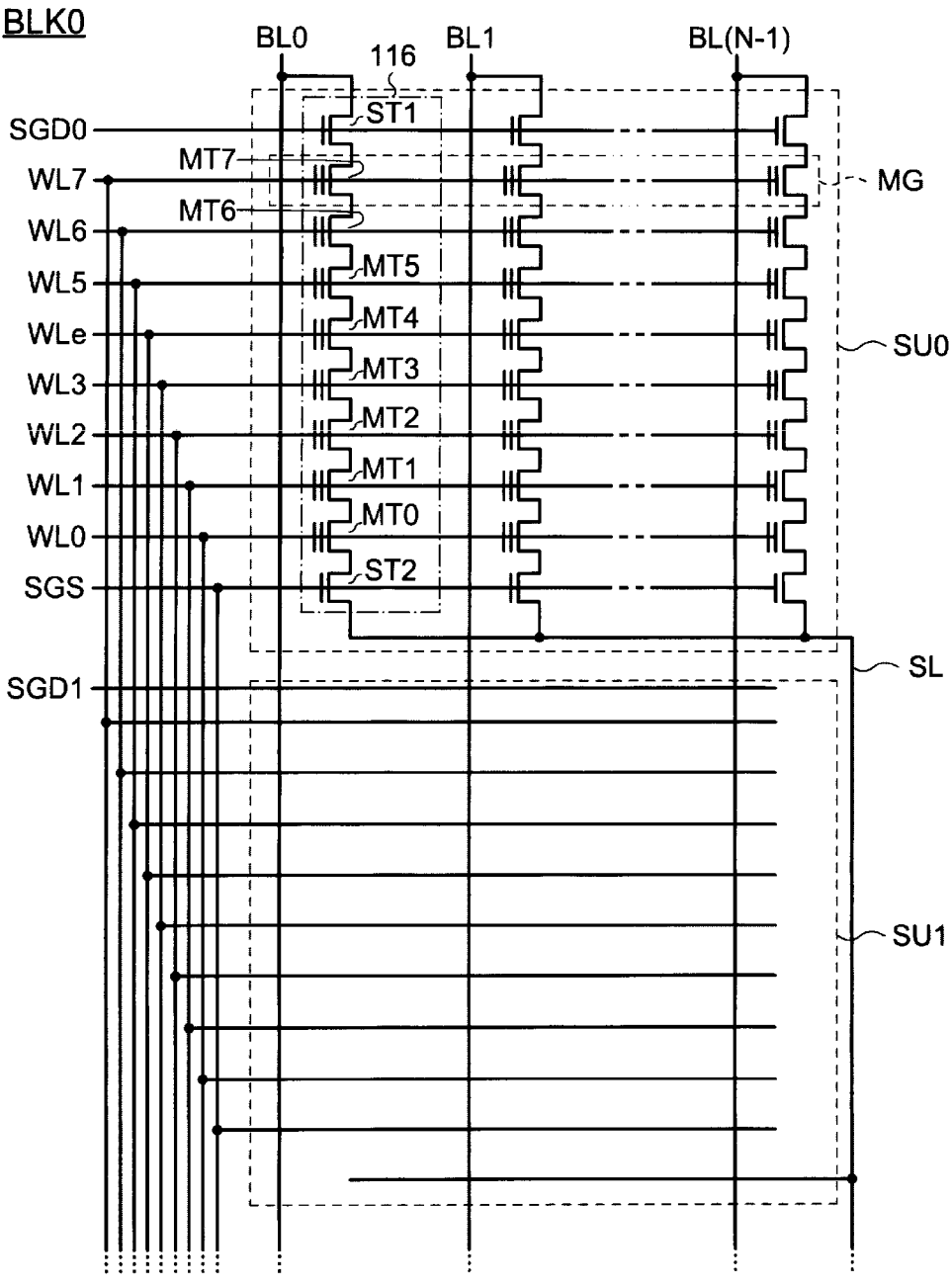
FIG. 4 is a circuit diagram showing a configuration of a memory cell in the first embodiment.

The semiconductor memory device 2 is connected to, for example, the memory controller 1 and is controlled by the memory controller 1. The semiconductor memory device 2 is a memory that stores data in a nonvolatile manner, and includes, for example, a NAND memory (NAND flash memory). The semiconductor memory device 2 includes i memory cells electrically connected to i bit lines BL. Each of the memory cells includes a memory cell transistor MT (FIG. 4). One memory cell (memory cell transistor MT) can be set to $2^n$ or more threshold voltages (n is a positive integer). In this case, a plurality of memory cells, which are a unit of a read operation and a write operation, can store data for n pages. For example, when the unit of data, which is a target of the read operation and the write operation, is 16 kB, the read operation and the write operation are performed collectively for $2^{17}$ memory cells.

For example, the semiconductor memory device 2 is a 5-bit/Cell (penta-level cell (PLC)) NAND memory having memory cells that are settable to threshold voltages to store 5 bits per memory cell ($2^5$ levels, 32 values). In this case, the $2^{17}$ memory cells as the unit of the read operation and the write operation can store data for five pages (16 kB×5).

In addition, as the semiconductor memory device 2, a 4-bit/Cell (quad-level cell (QLC)) NAND memory having memory cells that are settable to threshold voltages to store 4 bits per memory cell ($2^4$ levels, 16 values) may be used, a 3-bit/Cell (triple-level cell (TLC)) NAND memory having memory cells that are settable to threshold voltages to store 3 bits per memory cell ($2^3$ levels, 8 values) may be used, or a 2-bit/Cell (multi-level cell (MLC)) NAND memory having memory cells that are settable to threshold voltages to store 2 bits per memory cell ($2^2$ levels, 4 values) may be used.

The memory controller 1 receives, for example, a request for the operation of the semiconductor memory device 2 from the host 4 and transmits the request to the semiconductor memory device 2. The memory controller 1 transmits the request to the semiconductor memory device 2 and controls a data read operation of the semiconductor memory device 2, a data write operation of the semiconductor memory device 2, and a data erasing operation of the semiconductor memory device 2.

1-1-2. Configuration of Memory Controller 1

Figure 3:
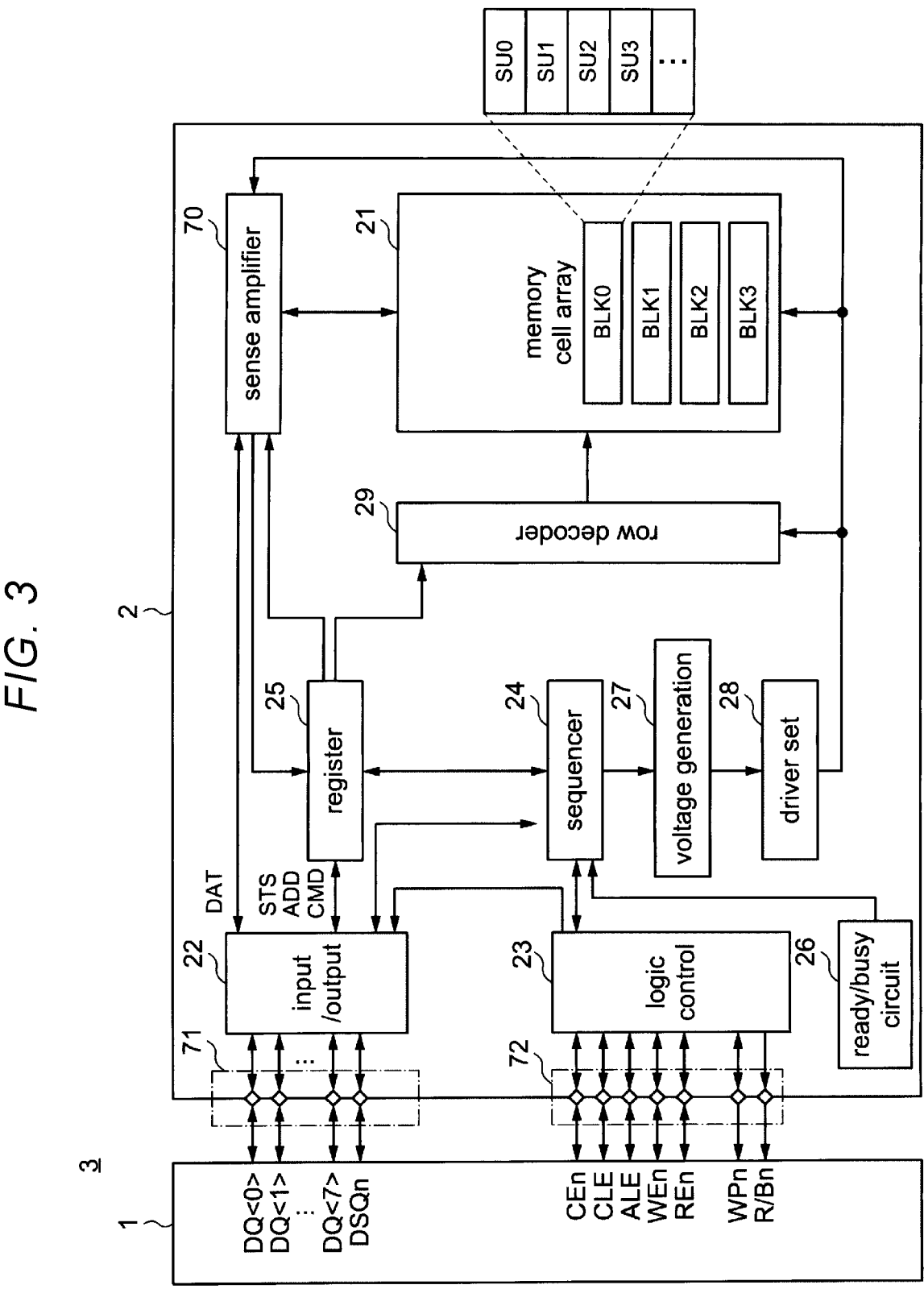
FIG. 3 is a block diagram showing a configuration of the memory system including the semiconductor memory device according to the first embodiment.

A configuration of the memory controller 1 will be described with reference to FIGS. 1 to 3. FIG. 2 is a block diagram showing a configuration of a subcode generator 17, and FIG. 3 is a block diagram showing a configuration of the memory system 3 including the semiconductor memory device 2.

Each of a chip enable signal CEn, a command latch enable signal CLE, an address latch enable signal ALE, a write enable signal WEn, a read enable signal REn, a write protect signal WPn, a signal DQ<7:0>, and a data strobe signal DQSn is exchanged between the memory controller 1 and the semiconductor memory device 2.

For example, the semiconductor memory device 2 and the memory controller 1 are each formed as a semiconductor chip (hereinafter, also simply referred to as a chip).

The chip enable signal CEn is a signal for enabling the semiconductor memory device 2. The command latch enable signal CLE is a signal for notifying an input/output circuit 22 that the signal DQ input to the semiconductor memory device 2 is a command CMD. The address latch enable signal ALE is a signal for notifying the input/output circuit 22 that the signal DQ input to the semiconductor memory device 2 is address information ADD.

The write enable signal WEn is a signal for latching a received signal in the semiconductor memory device 2 and is asserted by the memory controller 1 each time a command, an address, and data are received. For example, the semiconductor memory device 2 is instructed to latch the signal DQ<7:0> while the signal WEn is at a "low (L)" level.

The read enable signal REn is a signal for the memory controller 1 to read data from the semiconductor memory device 2. The read enable signal REn is used, for example, to control the operation timing of the semiconductor memory device 2 when outputting the signal DQ<7:0>.

The write protect signal WPn is a signal for instructing the semiconductor memory device 2 to inhibit data write and erasing. The signal DQ<7:0> contains data exchanged between the semiconductor memory device 2 and the memory controller 1. The signal DQ<7:0> is an 8-bit signal. The data strobe signal DQSn is a signal for controlling an input/output timing of the signal DQ<7:0>.

The memory controller 1 includes a random access memory (RAM) 11, a processor 12, a host interface 13, an error check and correct (ECC) circuit 14, a memory interface 15, and the subcode generator 17. The RAM 11, the processor 12, the host interface 13, the ECC circuit 14, the memory interface 15, and the subcode generator 17 are connected to each other by an internal bus 16.

The host interface 13 outputs a request received from the host 4, user data (e.g., write data), and the like to the internal bus 16. Further, the host interface 13 transmits the user data read from the semiconductor memory device 2, a response from the processor 12, and the like to the host 4.

The memory interface 15 controls a write operation of writing user data and the like to the semiconductor memory device 2 and a read operation of reading user data and the like from the semiconductor memory device 2, based on an instruction of the processor 12.

The processor 12 controls the memory controller 1. The processor 12 is, for example, a central processing unit (CPU), a micro processing unit (MPU), or the like. Upon receiving a request from the host 4 through the host interface 13, the processor 12 performs control in accordance with the request.

The ECC circuit 14 encodes the user data stored in the RAM 11 to generate codewords. In addition, the ECC circuit 14 decodes the codewords read from the semiconductor memory device 2.

The subcode generator 17 has a configuration and a function for generating a "subcode index" and "encoded data" which are included in an instruction to execute the "subprogram sequence", and combining the "subcode index" and the "encoded data".

The subprogram sequence is a method of programming and controlling a standard program sequence by using a plurality of sub-codings. The subprogram sequence is a method of control in which the plurality of sub-codings are overlaid and added to form a plurality of threshold voltage distributions, and is sometimes referred to as an addition method. In addition, although the details will be described below, in the subprogram sequence, data corresponding to the most significant threshold voltage distribution level of each sub-coding and data corresponding to the least significant threshold voltage distribution level of the next sub-coding are overlaid with each other.

The subcode generator 17 includes, for example, a subcode index register 171, a write data buffer 172, and a subcode encoder 173. The write data buffer 172 receives, for example, the user data stored in the RAM 11 and temporarily stores the user data. The subcode index register 171 stores an index indicating the order of sub-codings and an index indicating a page (for example, 01h, 02h, . . . , 05h, 11h, 12h, . . . , and 55h). The subcode encoder 173 generates a plurality of pieces of encoded data (EData) from the user data stored in the write data buffer 172. In addition, the subcode encoder 173 combines the index stored in the subcode index register 171 and EData corresponding to the index. Although the details will be described below, for example, when user data of 5-bit/Cell is encoded into EData of 3-bit/Cell, a plurality of pieces of the generated EData correspond to, for example, any of first page data, second page data, or third page data. The data capacity of one page is, for example, 16 kB, but is not limited thereto.

FIG. 1 shows a configuration example in which the memory controller 1 includes the ECC circuit 14 and the memory interface 15. However, the ECC circuit 14 may be incorporated into the memory interface 15. Further, the ECC circuit 14 may be incorporated into the semiconductor memory device 2.

The operation of the memory system 3 will be briefly described.

First, the operation of the memory system 3 when the request from the host 4 includes a command for issuing an instruction to execute the "standard program sequence" will be described.

For example, when the request from the host 4 includes a command for issuing an instruction to execute the "standard program sequence", the processor 12 instructs the memory interface 15 to perform the write operation of user data and parity to the semiconductor memory device 2 in accordance with the request from the host 4. Further, the processor 12 instructs the memory interface 15 to perform the read operation of the user data and the parity from the semiconductor memory device 2 in accordance with the request from the host 4.

The processor 12 determines a storage area (memory area) on the semiconductor memory device 2 for the user data stored in the RAM 11. The user data is stored in the RAM 11 through the internal bus 16. The processor 12 performs determination of the memory area for data of the page unit (page data, for example, 16 kB), which is the write unit. In the present specification, user data stored in one page of the semiconductor memory device 2 is defined as unit data. The unit data is generally encoded by the ECC circuit 14 and is stored in the semiconductor memory device 2 as a codeword. In the memory system 3, encoding is optional. The memory controller 1 may store the unit data in the semiconductor memory device 2 without encoding, but in FIG. 1, a configuration is shown in which encoding is performed as one configuration example. When the memory controller 1 does not perform encoding, the page data matches the unit data. In addition, one codeword may be generated based on one unit data, or one codeword may be generated based on divided pieces of data obtained by dividing the unit data. Further, one codeword may be generated using a plurality of pieces of unit data.

The processor 12 determines a memory area of the semiconductor memory device 2 to be written, for each piece of unit data. Physical addresses are assigned to the memory areas of the semiconductor memory device 2. The processor 12 manages the memory area, to which unit data is written, by using physical addresses. The processor 12 instructs the memory interface 15 to designate the determined memory area (physical address) and write the user data to the semiconductor memory device 2. The processor 12 manages correspondence between logical addresses of user data (logical addresses managed by the host 4) and physical addresses. When the processor 12 receives a read request including the logical address from the host 4, the processor 12 specifies a physical address corresponding to the logical address, designates the physical address, and instructs the memory interface 15 to read user data.

The RAM 11 temporarily stores the user data received from the host 4, until the user data is stored in the semiconductor memory device 2, or temporarily stores data read from the semiconductor memory device 2, until the read data is transmitted to the host 4. The RAM 11 is, for example, a general-purpose memory, such as a static random access memory (SRAM) or a dynamic random access memory (DRAM).

When a write request is received from the host 4, for example, the memory system 3 operates as follows. The processor 12 temporarily stores data, which is a write target, in the RAM 11. The processor 12 reads the data stored in the RAM 11 and inputs the read data to the ECC circuit 14. The ECC circuit 14 encodes the input data and inputs a codeword to the memory interface 15. The memory interface 15 writes the input codeword to the semiconductor memory device 2.

When a read request is received from the host 4, for example, the memory system 3 operates as follows. The memory interface 15 inputs the codeword read from the semiconductor memory device 2 to the ECC circuit 14. The ECC circuit 14 decodes the input codeword and stores the decoded data in the RAM 11. The processor 12 transmits the data stored in the RAM 11 to the host 4 through the host interface 13.

Next, the operation of the memory system 3 when the request from the host 4 includes a command for issuing an instruction to execute the "subprogram sequence" will be described.

In a general semiconductor memory device, in a case of n-bit/Cell (n is a positive integer), the number of latch circuits that store program data (for example, user data) and that are provided in the sense amplifier unit is n. For example, when the numerical value n is 5, the number of latch circuits that store the program data and that are provided in a sense amplifier unit CSAU (FIG. 15), which will be described below, is five in the write operation using the standard program sequence of user data of a 5-bit/Cell PLC. In the embodiments, the operation method of the memory system 3 includes the subprogram sequence, and also includes executing the write operation based on EData corresponding to TLC of a 3(n=3)-bit/Cell TLC in the write operation using the subprogram sequence of the user data of the 5-bit/Cell PLC. As shown in a sense amplifier unit SAU (FIG. 13), which will be described below, the number of latch circuits that store the program data and that are provided in the sense amplifier unit SAU is three (n=3). That is, by using the subprogram sequence, the number of latch circuits of the sense amplifier unit can be reduced by two.

The processor 12 determines a storage area (memory area) on the semiconductor memory device 2 for each of the plurality of pieces of generated EData. The EData is stored in the RAM 11 through the internal bus 16. The EData is page data, and the processor 12 performs the determination of the memory area for the EData. The EData is encoded by the ECC circuit 14 and is stored in the semiconductor memory device 2 as a codeword. For example, the memory controller 1 may store the EData in the semiconductor memory device 2 without encoding, or may store the encoded EData in the semiconductor memory device 2.

The processor 12 determines a memory area of the semiconductor memory device 2 to be written, for each piece of EData. The processor 12 instructs the memory interface 15 to designate the determined memory area (the physical address) and write the EData to the semiconductor memory device 2. The memory controller 1 and the semiconductor memory device 2 share the association between the logical address and the physical address of the user data and also share the subcode index. When the processor 12 receives a read request including the logical address from the host 4, the processor 12 specifies a physical address corresponding to the logical address, designates the physical address, and instructs the memory interface 15 to read user data.

When the write request including a command for issuing an instruction to execute the "subprogram sequence" is received from the host 4, for example, the memory controller 1 operates as follows. The processor 12 provided in the memory controller 1 transfers the EData, which is the write target, to the RAM from the subcode generator 17 and temporarily stores the EData in the RAM 11. The processor 12 reads the EData stored in the RAM 11 and inputs the EData to the ECC circuit 14. The ECC circuit 14 encodes the input EData and inputs the codeword to the memory interface 15. The memory interface 15 inputs the input codeword, for example, to a sequencer 24 through a logic control circuit 23. The sequencer 24 decodes the codeword, analyzes the command including the decoded EData, and instructs each circuit to execute the "subprogram sequence" based on an analysis result. For example, the logic control circuit 23 inputs the EData to the sense amplifier unit SAU in a sense amplifier module 70 through a register 25. In addition, the sense amplifier unit SAU writes the EData to the semiconductor memory device 2 through the bit line BL to which the sense amplifier unit SAU is connected.

When a read request is received from the host 4, for example, the memory system 3 operates as follows. The memory interface 15 inputs the codeword read from the semiconductor memory device 2 to the ECC circuit 14. The ECC circuit 14 decodes the input codeword and stores the decoded EData in the RAM 11. The processor 12 transmits the data stored in the RAM 11 to the host 4 through the host interface 13.

1-1-3. Configuration of Semiconductor Memory Device 2

As shown in FIG. 3, the semiconductor memory device 2 includes a memory cell array 21, the input/output circuit 22, the logic control circuit 23, the sequencer 24, the register 25, a ready/busy control circuit 26, a voltage generation circuit 27, a driver set 28, a row decoder 29, the sense amplifier module 70, an input/output pad group 71, and a logic control pad group 72. In the semiconductor memory device 2, various operations such as a write operation of storing write data DAT in the memory cell array 21, and a read operation of reading read data DAT from the memory cell array 21 are executed.

The memory cell array 21 is connected to, for example, the sense amplifier module 70, the row decoder 29, and the driver set 28. The memory cell array 21 includes a plurality of blocks BLK0, BLK1, . . . , and BLKn (n is an integer of 1 or more). Although details will be described below, each of the blocks BLK includes a plurality of string units SU (SU0, SU1, SU2, SU3). Each of the string units SU includes a plurality of nonvolatile memory cells associated with bit lines and word lines. The block BLK is, for example, an erase unit for data. The data stored in memory cell transistors MTe0 to MTe7 and MTo0 to MTo7 (FIG. 4) provided in the same block BLK are collectively erased. In the semiconductor memory device 2, the memory cell transistor MT may be simply referred to as a memory cell.

The input/output circuit 22 is connected to, for example, the register 25, the logic control circuit 23, and the sense amplifier module 70. The input/output circuit 22 controls the exchange of the data signal DQ<7:0> between the memory interface 15 provided in the memory controller 1 and the semiconductor memory device 2.

As described in "1-1-2. Configuration of Memory Controller 1", the signal DQ<7:0> includes data exchanged between the semiconductor memory device 2 and the memory interface 15 provided in the memory controller 1. The signal DQ<7:0> includes a command CMD, data DAT, address information ADD, status information STS, and the like.

The command CMD includes, for example, a command for executing a request transmitted from the host 4 to the semiconductor memory device 2 through the memory interface 15 provided in the memory controller 1. The command CMD includes, for example, a prefix command for issuing an instruction to execute the "subprogram sequence". The data DAT includes write data DAT to the semiconductor memory device 2 or read data DAT from the semiconductor memory device 2. The data DAT includes, for example, EData. The address information ADD includes, for example, column addresses and row addresses for selecting a plurality of nonvolatile memory cells associated with bit lines and word lines. The status information STS includes, for example, information regarding the status of the semiconductor memory device 2 with respect to the write operation and the read operation.

Specifically, the input/output circuit 22 includes an input circuit and an output circuit, and the input circuit and the output circuit perform the following processing. The input circuit receives the write data DAT, the address information ADD, and the command CMD from the memory controller 1. The input circuit transmits the received write data DAT to the sense amplifier module 70 and transmits the received address information ADD and the received command CMD to the register 25. Meanwhile, the output circuit receives the status information STS from the register 25 and receives the read data DAT from the sense amplifier module 70. The output circuit transmits the received status information STS and read data DAT to the memory interface 15 provided in the memory controller 1.

The logic control circuit 23 is connected to, for example, the memory controller 1 and the sequencer 24. The logic control circuit 23 receives, for example, the chip enable signal CEn, the command latch enable signal CLE, the address latch enable signal ALE, the write enable signal WEn, the read enable signal REn, and the write protect signal WPn through the memory interface 15 of the memory controller 1. The logic control circuit 23 controls the input/output circuit 22 and the sequencer 24 based on the received signal.

The sequencer 24 is connected to, for example, the ready/busy control circuit 26, the sense amplifier module 70, and the driver set 28. The sequencer 24 controls the operation of the entire semiconductor memory device 2 based on the command CMD stored in a command register. For example, the sequencer 24 controls the sense amplifier module 70, the row decoder 29, the voltage generation circuit 27, the driver set 28, and the like to execute various operations such as the write operation, the read operation, and the erasing operation. Although the details will be described below, when a prefix command to execute the "subprogram sequence" is stored in the command register, the sequencer 24 instructs the semiconductor memory device 2 to execute the subprogram sequence instead of the standard program sequence.

The register 25 includes, for example, a status register (not shown), an address register (not shown), a command register (not shown), and the like. The status register receives and stores the status information STS from the sequencer 24, and transmits the status information STS to the input/output circuit 22 based on an instruction of the sequencer 24. The address register receives and stores the address information ADD from the input/output circuit 22. The address register transmits the column address in the address information ADD to the sense amplifier module 70 and transmits the row address in the address information ADD to the row decoder 29. The command register receives and stores the command CMD from the input/output circuit 22, and transmits the command CMD to the sequencer 24. The command register can store the prefix command to execute the "subprogram sequence" included in the command CMD.

The ready/busy control circuit 26 generates a ready/busy signal R/Bn in accordance with the control by the sequencer 24 and transmits the generated ready/busy signal R/Bn to the memory controller 1. The ready/busy signal R/Bn is a signal for issuing a notification of whether the semiconductor memory device 2 is in a ready state in which it is capable of receiving a command from the memory controller 1 or in a busy state in which it is not capable of receiving the command.

The voltage generation circuit 27 is connected to, for example, the driver set 28 or the like. The voltage generation circuit 27 generates a voltage that is used for the write operation, the read operation, and the like, based on the control by the sequencer 24, and supplies the generated voltage to the driver set 28.

The driver set 28 is connected to the memory cell array 21, the sense amplifier module 70, and the row decoder 29. The driver set 28 generates various voltages or various control signals to be supplied to, for example, a select gate line SGD (FIG. 4), the word line WL (FIG. 4), a source line SL (FIG. 4), the bit line BL (FIG. 4), and the like in various operations such as a read operation and a write operation, based on the voltage supplied from the voltage generation circuit 27 or the control signal supplied from the sequencer 24. The driver set 28 supplies the generated voltage or control signal to the sense amplifier module 70, the row decoder 29, the source line SL, and the like.

The row decoder 29 receives a row address from the address register and decodes the received row address. The row decoder 29 selects a target block BLK (FIG. 4) to execute various operations such as a read operation and a write operation, based on the result of the decoding. The row decoder 29 can supply the voltage supplied from the driver set 28 to the selected block BLK.

The sense amplifier module 70 receives, for example, a column address from the address register and executes an exchange operation of the data DAT between the memory controller 1 and the memory cell array 21 based on the column address. In addition, the sense amplifier module 70 can sense the threshold voltage corresponding to data read from the memory cell array 21 and temporarily store the read data, based on a command related to the read operation. Further, the sense amplifier module 70 can perform a logical operation based on the temporarily stored data. Further, the sense amplifier module 70 transmits the read data (read data) DAT to the memory controller 1 through the input/output circuit 22. Furthermore, the sense amplifier module 70 receives the write data DAT from the memory controller 1 through the input/output circuit 22 and performs operations to write the write data DAT in the memory cell array 21, based on the command related to the write operation.

The sense amplifier module 70 includes, for example, the sense amplifier unit SAU (FIG. 13) provided for each bit line BL (BL0 to BL(N−1), where (N−1) is a natural number of 2 or more, FIG. 4). The sense amplifier unit SAU is electrically connected to the bit line BL such that the sense amplifier unit SAU can supply a voltage to the bit line BL. The semiconductor memory device 2 includes the memory cell transistor MT of the PLC (5-bit/Cell). Details will be described below, but the number of latch circuits provided in the sense amplifier unit SAU that store the program data (for example, EData) is three.

The input/output pad group 71 transmits the signal DQ<7: 0> received from the memory controller 1 to the input/output circuit 22. The input/output pad group 71 transmits the signal DQ<7:0> received from the input/output circuit 22 to the memory controller 1.

The logic control pad group 72 transfers the chip enable signal CEn, the command latch enable signal CLE, the address latch enable signal ALE, the write enable signal WEn, and the read enable signal REn received from the memory controller 1 to the logic control circuit 23. The logic control pad group 72 transfers the ready/busy signal R/Bn received from the ready/busy control circuit 26 to the memory controller 1.

1-1-4. Configuration of Memory Cell Array 21

The configuration of the memory cell array 21 will be described with reference to FIG. 4. FIG. 4 is a circuit diagram of the block BLK provided in the memory cell array 21 of the semiconductor memory device 2. The block BLK0 will be described as an example, but other blocks BLK1, 2, . . . are also the same circuits. The circuit diagram shown in FIG. 4 is an example and embodiments are not limited to the circuit diagram shown in FIG. 4. In the description of the memory cell array 21, the description of the same or similar configuration as in FIGS. 1 to 3 may be omitted.

The block BLK0 is connected to N bit lines BL (BL0, BL1, . . . , and BL(N–1)). In addition, the block BLK0 is connected to the source line SL. A NAND string 116 is connected between the bit line BL and the source line SL. The NAND string 116 includes, for example, eight memory cell transistors MT (MT0 to MT7) and select transistors ST1 and ST2. The memory cell transistor MT includes a control gate and a charge storage layer, and stores data in a non-volatile manner. The memory cell transistor MT is connected in series between the source of the select transistor ST1 and the drain of the select transistor ST2. The NAND strings 116 are provided on the N bit lines BL so that string units SU (SU0, SU1) are configured therefrom. In FIG. 4, the NAND string 116 includes, for example, eight memory cell transistors MT, but the number of memory cell transistors MT provided in the NAND string 116 is not limited to eight. For example, the number of memory cell transistors MT may be i, and the integer i may be more than 8 or may be less than 8.

The select transistor ST1 (corresponding to a lower-layer select gate transistor, which will be described below) is connected to a select gate line SGD0. The gate of the select transistor ST1 in each of the string units SU is connected to a select gate line SGD (one of SGD0, SGD1, . . . ). The gates of the eight memory cell transistors MT (MT0 to MT7) are connected to the corresponding word lines WL (WL0 to WL7), respectively. In addition, the gate of the select transistor ST2 in each of the string units SU is connected to a select gate line SGS. The gates of the select transistors ST1 in the same string unit SU that are respectively connected to the plurality of bit lines BL are connected to a common select gate line SGD. The gates of the memory cell transistors MT (MT0 to MT7) in the same string unit SU are connected to respective common word lines WL (WL0 to WL7). In the same string unit SU, the memory cell transistors MT (MT0 to MT7) connected to the same word lines WL (WL0 to WL7) make up the unit of the read operation and the write operation. For example, the memory cell transistor MT7 in each of the NAND strings 116 provided in the string unit SU corresponding to the select gate line SGD0 make up a memory cell group MG as the unit of the read operation and the write operation, and the read operation and the write operation are collectively executed for the memory cell group MG. For example, when the unit of data, which is a target of the read operation and the write operation, is 16 kB, each memory cell group MG includes $2^{17}$ memory cell transistors MT. In this case, $2^{17}$ bit lines BL are provided.

1-1-5. Threshold Voltage Distribution of Memory Cell Transistor MT

Figure 5:
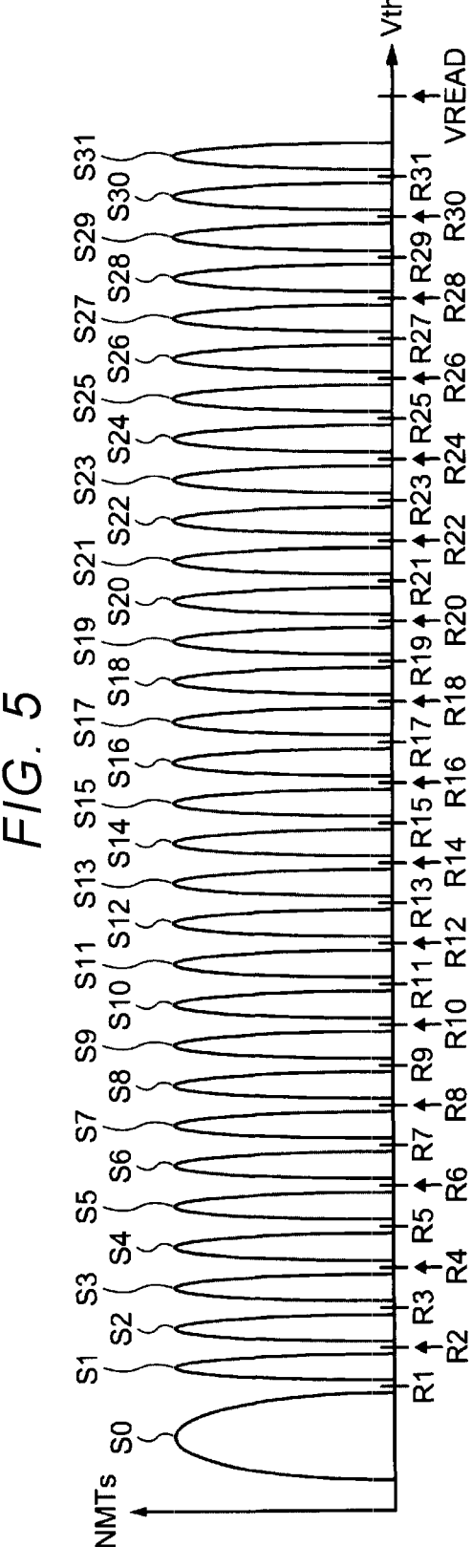
FIG. 5 is a schematic diagram showing an example of a threshold voltage distribution of a memory cell transistor in the first embodiment.

The PLC will be described as an example of the threshold voltage distribution of the memory cell transistor MT with reference to FIGS. 5 and 6. FIG. 5 is a schematic diagram showing an example of the threshold voltage distribution of the memory cell transistor MT. FIG. 6 is a diagram showing an example of assignment of data to different threshold voltage states of the memory cell transistor MT. In the description of the memory cell transistor MT, the description of the same or similar configuration as in FIGS. 1 to 4 may be omitted.

"NMTs" on the vertical axis of FIG. 5 indicates the number of memory cell transistors MT (the number of cells), and "Vth" on the horizontal axis of FIG. 5 indicates the threshold voltage of the memory cell transistors MT. As shown in FIG. 5, the threshold voltage distribution of the memory cell transistor MT in the memory cell array 21 may form states S0, S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, and S31 in ascending order of threshold voltages. That is, in the PLC, 32 lobe-shaped threshold voltage distributions are formed, and it is possible to store 5 bits of data per memory cell transistor MT by assigning data to each of the 32 lobe-shaped threshold voltage distributions of the PLC.

In addition, in the memory cell array 21, read voltages R1 to R31 and a read pass voltage VREAD are set for the states S0 to S31. Specifically, the read voltage R1 is set between the states S0 and S1, and the read voltage R2 is set between the states S1 and S2. Further, similar to the read voltage R1 and the read voltage R2, the read voltage R3 to the read voltage R30 are set between the respective corresponding states as shown in FIG. 5. The read pass voltage VREAD is set to a voltage higher than the voltage of the state S31 having the highest threshold voltage among the states S0 to S31. The memory cell transistor MT, to which the read pass voltage VREAD is applied to the gate, enters an ON state regardless of the data stored therein.

A set of read voltages R1 to R31 shown in FIG. 5 may include a negative voltage. The set of read voltages R1 to R31 may be a combination of a negative voltage, 0 V, and a positive voltage. That is, in the set of read voltages R1 to R31, some of the read voltages may be negative voltages, and the other read voltages may be 0 V or positive read voltages. For example, each of the read voltages R1 to R4 may be a negative voltage, the read voltage R5 may be 0 V, and each of the read voltages R6 to R31 may be a positive voltage. In addition, the set of read voltages R1 to R31 may include a negative voltage and a positive voltage without including 0 V.

Any of data sets D0 to D31 is assigned to each of the states S0 to S31. The data sets D0 to D31 correspond to 32 sets of mutually different 5-bit data. Each of the data sets D0 to D31 includes first to fifth bit data. Hereinafter, the contents of specific data of each of the data sets D0 to D31 will be listed.

"Example" Data set: "first bit data/second bit data/third bit data/fourth bit data/fifth bit data"

D0: "00000"
D1: "00001"
D2: "00010"
D3: "00011"
D4: "00100"
D5: "00101"
D6: "00110"
D7: "00111"
D8: "01000"
D9: "01001"
D10: "01010"
D11: "01011"

D12: "01100"
D13: "01101"
D14: "01110"
D15: "01111"
D16: "10000"
D17: "10001"
D18: "10010"
D19: "10011"
D20: "10100"
D21: "10101"
D22: "10110"
D23: "10111"
D24: "11000"
D25: "11001"
D26: "11010"
D27: "11011"
D28: "11100"
D29: "11101"
D30: "11110"
D31: "11111"

In addition, for example, the "0" level among the above-described threshold voltage distributions corresponds to the erase state (state S0) of the memory cell transistor MT. That is, the data set D31 corresponds to the "0" level. Similarly, the "1" level to "31" level associated with any one of the states S1 to S31 is associated with any one of the data sets D0 to D30. Therefore, each level, each data set, and each state are uniquely associated with each other.

Further, for example, when the data assigned as shown in FIG. 6 is read, the data from the first page is decided on through a read operation using the read voltages R1, R3, R5, R14, R16, and R21. The data from the second page is decided on through a read operation using the read voltages R2, R10, R13, R17, R23, and R27. The data from the third page is decided on through a read operation using the read voltages R4, R8, R15, R24, R26, and R29. The data from the fourth page is decided on through a read operation using the read voltages R6, R12, R18, R20, R22, R28, and R30. The data from the fifth page (is decided on through a read operation using the read voltages R7, R9, R11, R19, R25, and R31. The write operation and the read operation of the data are collectively performed for the plurality of memory cells. That is, the write operation and the read operation of the data are performed in a page unit. The data assignment as described above is referred to as, for example, "code" or "coding". As described above, when data assignment is made as above, the adjacent states form a Gray code with a one-bit difference.

1-1-6. Cross-Sectional Structure of Memory Cell Array 21

Figure 7:
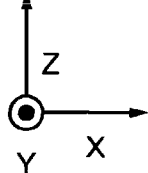
FIG. 7 is a cross-sectional view showing a cross section of the memory cell in the first embodiment.

A cross-sectional structure of a stacked body 400 constituting the memory cell array 21 will be described with reference to FIG. 7. The cross-sectional structure shown in FIG. 7 is an example and embodiments are not limited to the cross-sectional structure of the memory cell array 21 shown in FIG. 7. In the description of the memory cell array 21, the description of the same or similar configuration as in FIGS. 1 to 6 may be omitted.

In the stacked body 400, a memory cell array layer 410 and an SGD (drain side select gate) layer 420 are stacked on a semiconductor substrate 401 through an insulating film.

The memory cell array layer 410 is a stacked body in which a large number of conductive films 411, 412, 413, . . . , and 414 and the insulating films are alternately stacked. A large number of through via holes (memory holes MH) are formed in the memory cell array layer 410. Inside the memory hole MH, an insulating film ($SiO_2$ film or SiN film), a charge storage film (SiN film), and a gate oxide film ($SiO_2$ film) are stacked from the side wall of the memory hole MH toward the inside, and a semiconductor film (Si film) is embedded inside the gate oxide film. The conductive film 411 located in the lowermost layer of the memory cell array layer 410 corresponds to the gate of the select transistor ST2. The conductive films 412, 413, . . . , and 414 located from the second layer to the uppermost layer of the memory cell array layer 410 correspond to the gates of the memory cell transistors MT.

The SGD layer 420 is provided above the conductive film 414. A large number of through via holes (memory holes MH) are formed in the SGD layer 420 in the same manner as in the memory cell array layer 410. The SGD layer 420 corresponds to the gate of the select transistor ST1.

The stacked body 400 is electrically separated from the adjacent stacked body 400 with a memory slit ST interposed therebetween, which vertically penetrates the stacked body 400. The memory slit ST is filled with a conductive material to form a source line contact vertically penetrating the stacked body 400. The source line contact constitutes a part of the source line SL.

1-2. Operation Example

1-2-1. Overview of Write Operation

Mainly, the overview of the write operation of data will be described with reference to FIGS. 8 to 10. The write operation includes a program operation and a verify operation. When multi-value data is written to the memory cell transistor MT, the threshold voltage of the memory cell transistor MT is set to a value corresponding to the value of the data. When a program voltage VPGM and a bit line voltage Vbl are applied to the memory cell transistor MT, electrons are injected into the charge storage film of the memory cell transistor MT, and the threshold voltage increases. By increasing the program voltage VPGM, the amount of electrons injected can be increased, and the threshold voltage of the memory cell transistor MT can be increased. However, the amount of electrons injected varies depending on the memory cell transistor MT even when the same program voltage VPGM is applied because of the variations in the memory cell transistor MT. Once injected, the electrons are retained until an erasing operation is performed. Therefore, a plurality of program loops (for example, L times, where L is an integer of 1 or more) are executed a plurality of times in the write operation while gradually increasing the program voltage VPGM such that the threshold voltage to be set for each memory cell transistor MT falls within an allowable threshold voltage range. Each program loop includes, for example, one program operation and one or a plurality of verify operations (for example, S times, where S is an integer of 1 or more) executed thereafter. In the write operation, a program loop including a program operation and a verify operation is executed a plurality of times. In any one program loop, the verify operation may be omitted. In the description of the overview of the write operation of data, the description of the same or similar configuration as in FIGS. 1 to 7 may be omitted.

The program operation is an operation of increasing the threshold voltage by injecting electrons into the charge storage layer (or maintaining the threshold voltage by inhibiting the injection). Hereinafter, the operation of increasing the threshold voltage is referred to as a "0" program or a "0" write, and "O" data is given to the bit line BL that is a target of the "0" program. On the other hand, an operation of maintaining the threshold voltage is referred to as a "1" program, a "l" write, or a write inhibit, and "1" data is given to the bit line BL that is a target of the "1" program.

The verify operation is a read operation performed as a part of the write operation. The verify operation is an operation of reading data after the program operation to determine whether the threshold voltage of the memory cell transistor MT has reached the target state. The memory cell transistor MT whose threshold voltage has reached the target state is then write-inhibited. By repeating the combination of the above program operation and verify operation, the threshold voltage of the memory cell transistor MT is increased to the target state.

Figure 8:
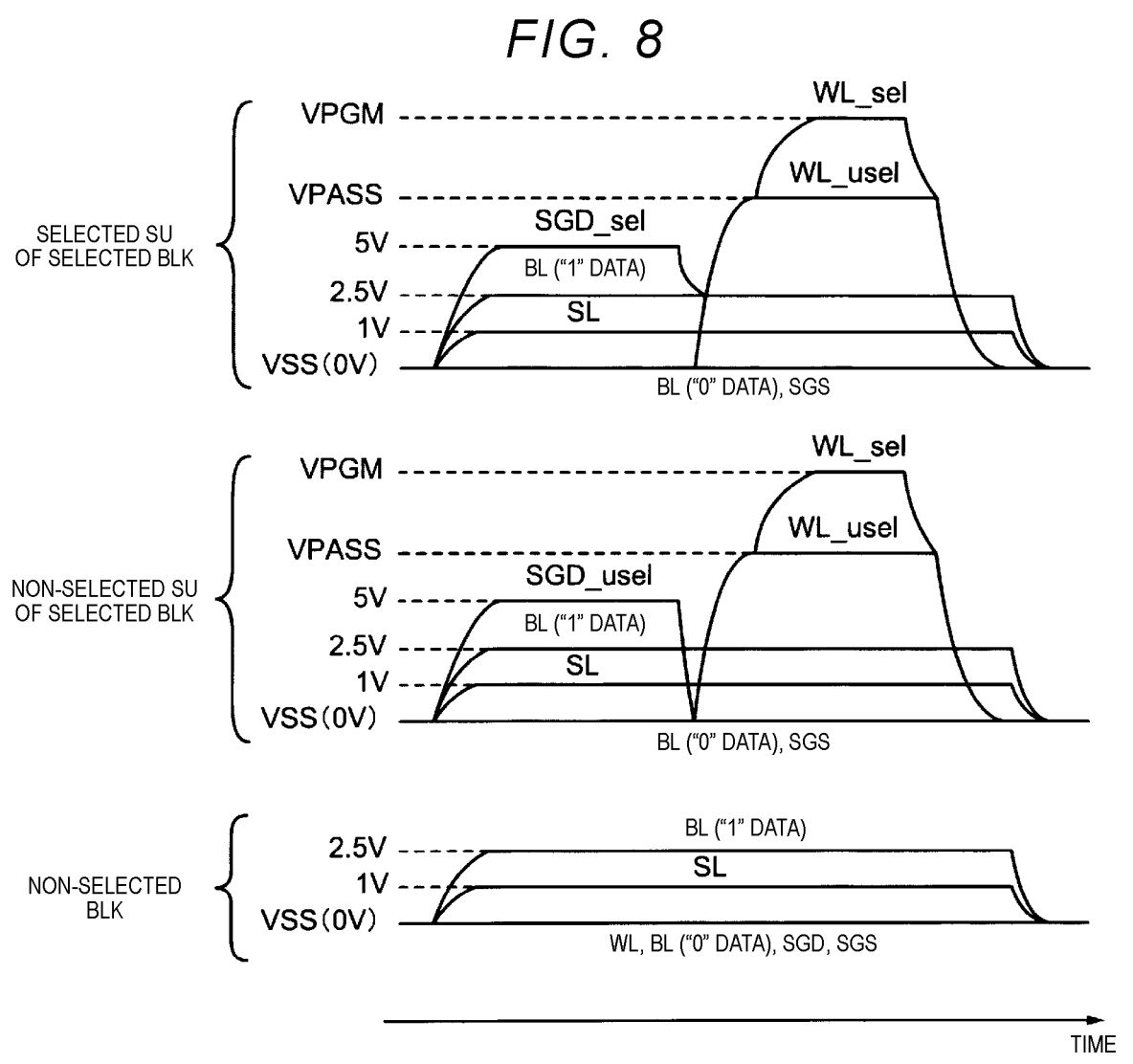

FIG. 8 is a diagram showing a potential change of each wiring line in the program operation. Each voltage shown in FIG. 8 is generated by, for example, the voltage generation circuit 27 controlled by the sequencer 24.

The program operation is performed in accordance with a program voltage and a bit line voltage applied to the word line and the bit line. For the string unit SU (selected SU), which is the write target, of the block BLK (selected BLK), which is the write target, the select gate line SGD (SGD_sel) is set to, for example, 5 V before the application of the program voltage VPGM, and the select transistor ST1 is made conductive. In addition, during the program operation, the select gate line SGS is, for example, 0 V. Therefore, the select gate transistor ST2 enters an OFF state. After that, when the program voltage VPGM is applied, the select gate line SGD (SGD_sel) is set to, for example, 2.5 V. As a result, the conduction and non-conduction states of the select transistor ST1 are determined by the bit line voltage of the bit line BL connected to the select transistor ST1.

In addition, for the string unit SU (non-selected SU), which is not the write target, of the block BLK (selected BLK), which is the write target, the select gate line SGD (SGD_usel) is set to, for example, 5 V before the application of the program voltage VPGM, and the select transistor ST1 is made conductive. After that, when the program voltage VPGM is applied, the select gate line SGD (SGD_usel) is set to, for example, 0 V. As a result, the select transistor ST1 becomes non-conductive and is electrically disconnected from the bit line BL.

In the block BLK (non-selected BLK) that is not the write target, 0 is applied to the select gate line SGD and the select gate line SGS. As a result, the select transistor ST1 and the select transistor ST2 enter an OFF state.

As described above, the sense amplifier module 70 transfers data to each bit line BL. A ground voltage Vss of, for example, 0 V is applied as a bit line voltage Vbl_L to the bit line BL to which the "O" data is given. A write inhibit voltage Vinhibit (for example, 2.5 V) is applied as a bit line voltage Vbl_H to the bit line BL to which the "1" data is given. Therefore, when the program voltage VPGM is applied, the select transistor ST1 connected to the bit line BL to which the "0" data is given enters a conduction state, and the select transistor ST1 connected to the bit line BL to which the "1" data is given is cutoff. The memory cell transistor MT connected to the cutoff select transistor ST1 is write-inhibited.

The memory cell transistor MT connected to the select transistor ST1 in a conduction state is subjected to the injection of electrons into the charge storage film in accordance with the voltage applied to the word line WL. As the word line voltage, the memory cell transistor MT connected to the word line WL to which a voltage VPASS is applied enters a conduction state regardless of the threshold voltage, but the injection of electrons into the charge storage film is not performed. On the other hand, as the word line voltage, the memory cell transistor MT connected to the word line WL to which the program voltage VPGM is applied is subjected to the injection of electrons into the charge storage film according to the program voltage VPGM.

That is, the row decoder 29 selects one of the word lines WL in the selected block BLK, applies the program voltage VPGM to the selected word line, and applies the voltage VPASS to the other word lines (non-selected word lines) WL. The program voltage VPGM is a high voltage for injecting electrons into the charge storage film through the tunneling phenomenon, and VPGM>VPASS. The state of the string unit SU at this time is shown in FIG. 9.

Figure 9:
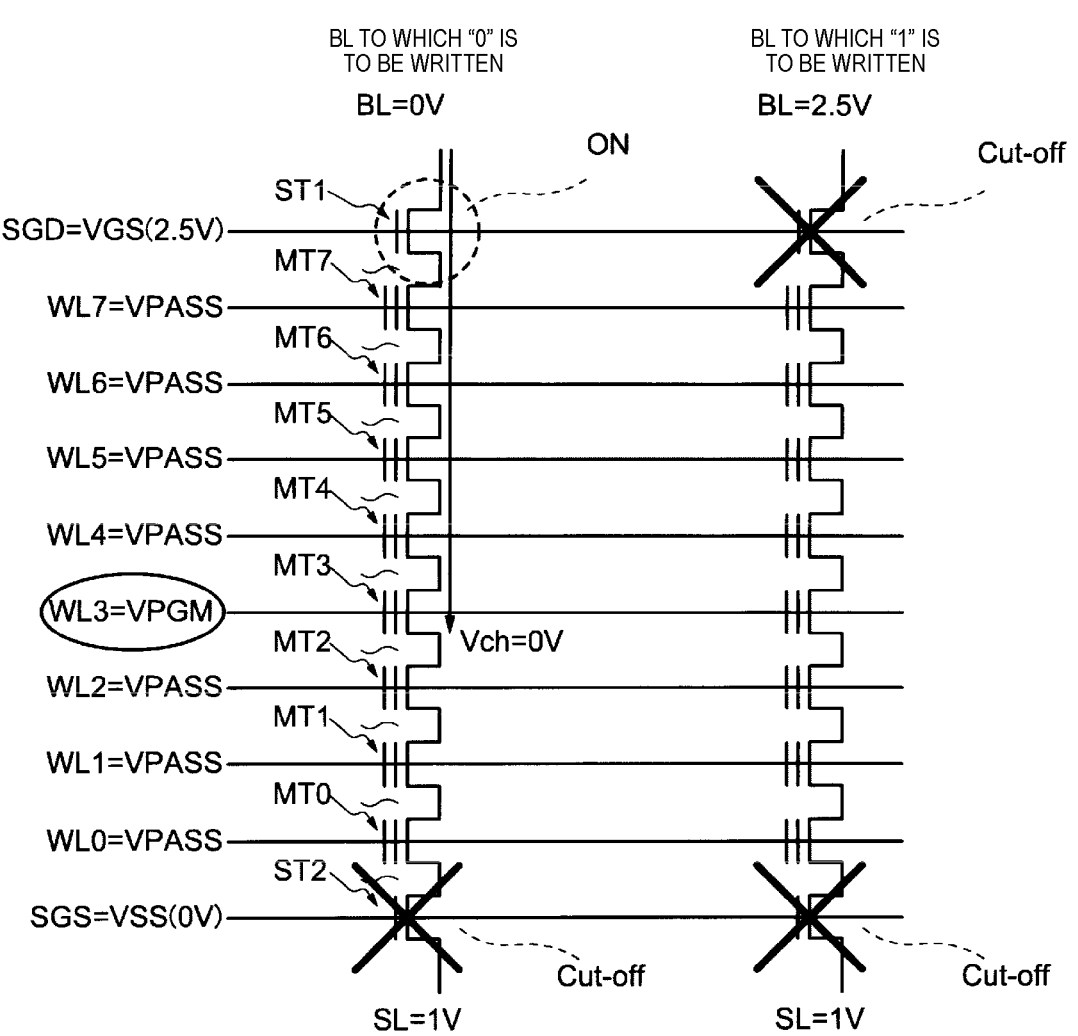
FIG. 9 is a circuit diagram showing a state of a NAND string during a program operation of the memory system according to the first embodiment.

FIG. 9 is a circuit diagram showing a state of the NAND string during the program operation. FIG. 9 shows two NAND strings corresponding to the bit line BL, which is the "0" write target, and the bit line BL, which is the "1" write target. In addition, a state in which the word line WL3 is selected is shown. Each voltage shown in FIG. 9 is generated by, for example, the voltage generation circuit 27 controlled by the sequencer 24, as in FIG. 8.

As shown in FIG. 9, the voltage VPGM is applied to the selected word line WL3, and the voltage VPASS is applied to the non-selected word lines WL0 to WL2 and WL4 to WL7. In the NAND string corresponding to the bit line BL, which is the "0" write target, the select transistor ST1 enters an ON state. Therefore, a channel voltage Vch of the memory cell transistor MT3 connected to the selected word line WL3 becomes 0 V. That is, a potential difference between a control gate and a channel increases, and as a result, electrons are injected into the charge storage layer, which leads to an increase in the threshold voltage of the memory cell transistor MT3.

In the NAND string corresponding to the bit line BL, which is the "1" write target, the select transistor ST1 enters a cutoff state. Therefore, the channel of the memory cell transistor MT3 connected to the selected word line WL3 becomes electrically floating and the channel voltage Vch is increased to a voltage near the voltage VPASS by capacitance coupling with the word line WL and the like. That is, the potential difference between the control gate and the channel decreases, and as a result, the electrons are not injected into the charge storage layer, and the threshold voltage of the memory cell transistor MT3 is maintained (the threshold voltage does not fluctuate significantly as the threshold voltage distribution level transitions to a higher distribution).

The write operation (program operation) for each of the memory cell transistors MT of the memory cell array 21 is performed by controlling the voltage of the word line WL through the row decoder 29 and supplying the data to each of the bit lines BL by the sense amplifier module 70.

FIG. 10 is a diagram showing a potential change of each wiring line in the verify operation. Each voltage shown in FIG. 10 is also generated by the voltage generation circuit 27 controlled by the sequencer 24.

The verify operation, that is, the read of data from the multivalued memory cell transistor, is performed by applying a read voltage to the selected word line WL (hereinafter, also referred to as WL_sel) through the row decoder 29, and sensing the data read to the bit line BL to determine whether the read data is "0" or "1" through the sense amplifier module 70. In order to make the memory cell transistor connected to the non-selected word line WL (hereinafter, also referred to as WL_usel) conductive, the row decoder 29 applies a sufficiently high voltage VREAD required to turn on each memory cell transistor to the non-selected word line WL_usel. For the adjacent word line, a voltage VREADK slightly higher than the voltage VREAD may be applied in order to facilitate conduction of the memory cell transistor connected to the adjacent word line.

In addition, the row decoder 29 applies a voltage VSG for turning on the select transistor ST1 to the select gate line SGD (hereinafter, also referred to as SGD_sel) corresponding to a string unit (selected string unit), which is the read target among the string units SU, and applies a voltage Vss (for example, 0 V) for turning off the select transistor ST1 to the select gate line SGD (hereinafter, also referred to as an non-selected gate line SGD_usel) corresponding to a string unit (non-selected string unit), which is not the read target. After the voltage VSG for turning on the select transistor ST1 is applied to the non-selected gate line SGD_usel, the voltage Vss for turning off the select transistor ST1 may be applied.

The row decoder 29 applies a read voltage to the selected word line WL_sel and applies a voltage VREAD or VREADK to the non-selected word line WL_usel. During the read operation, the sense amplifier module 70 fixes the bit line BL at a constant voltage (for example, 1 V) and charges a sense node SEN (FIG. 13) in the sense amplifier unit SAU (FIG. 13) provided in the sense amplifier module 70 to a predetermined precharge voltage Vpre higher than the voltage of the bit line BL. In this state, the logic control circuit 23 connects the sense node SEN to the bit line BL. A current flows from the sense node SEN to the bit line BL, and the voltage of the sense node SEN gradually decreases.

The voltage of the sense node SEN changes according to the state of the threshold voltage of the memory cell transistor connected to the corresponding bit line BL. That is, when the threshold voltage of the memory cell transistor is lower than the read voltage, the memory cell transistor is in an ON state, a large cell current flows through the memory cell transistor, and the rate of decrease in the voltage of the sense node SEN becomes faster. In addition, when the threshold voltage of the memory cell transistor is higher than the read voltage, the memory cell transistor is in an OFF state, the cell current flowing through the memory cell transistor is small or no cell current flows through the memory cell transistor, and the rate of decrease in the voltage of the sense node SEN becomes slower.

A state of writing to the memory cell transistor is determined by using a difference in the rate of decrease in the voltage of the sense node SEN, and the result is stored in the latch circuit. For example, at a first point in time when a predetermined first period has elapsed from the discharge start when the charge at the sense node SEN starts to be discharged, it is determined whether the voltage of the sense node SEN is at a low level (hereinafter, also referred to as "L" or "0") or at a high level (hereinafter, also referred to as "H" or "1"). For example, when the threshold voltage of the memory cell transistor is lower than the read voltage, the memory cell transistor is in a completely ON state, and a large cell current flows through the memory cell transistor. Therefore, the voltage of the sense node SEN rapidly decreases, the voltage drop amount is relatively large, and the sense node SEN becomes "L" at the first point in time.

In addition, when the threshold voltage of the memory cell transistor is higher than the read voltage, the memory cell transistor is in an OFF state, and the cell current flowing through the memory cell transistor is very small, or no cell current flows through the memory cell transistor. Therefore, the voltage of the sense node SEN decreases very slowly, the voltage drop amount is relatively small, and the sense node SEN remains "H" at the first point in time.

The sense amplifier module 70 monitors the state of the sense node SEN while the read voltage is applied to the selected word line WL_sel by the row decoder 29, so that it is determined whether the threshold voltage of the memory cell transistor is higher or lower than the read voltage. Therefore, the state of each memory cell transistor can be determined by applying the voltage between the states to the selected word line WL_sel as the read voltage, and the data assigned to each state can be read.

In the memory system 3, when the user data of 5-bit/Cell is encoded into EData of 3-bit/Cell based on the prefix command to execute the "subprogram sequence", EData is assigned to, for example, eight threshold voltage distributions of the TLC of 3-bit/Cell as shown in FIG. 14A. Each memory cell transistor is written at any state of Er, A, B, . . . , and G states corresponding to the eight threshold voltage distributions, and during reading, the value of the data of each memory cell transistor can be determined by applying voltages VrA to VrG. In the following description, the read voltages that are applied to the selected word line WL_sel in the verify operation are indicated by voltages $VfyA_1$ to $VfyG_1$.

Different data sets are assigned to the threshold voltage distributions of the "Er", "A", "B", "C", "D", "E", "F", and "G" states. For example, the following is assigned. The assignment of the threshold voltage distribution and the data may be freely set.

"Example" Data set: "first bit data/second bit data/third bit data"

Er: "111"
A: "011"
B: "001"
C: "000"
D: "010"
E: "110"
F: "100"
G: "101"

1-2-2. Example of Write Operation

Figure 12:
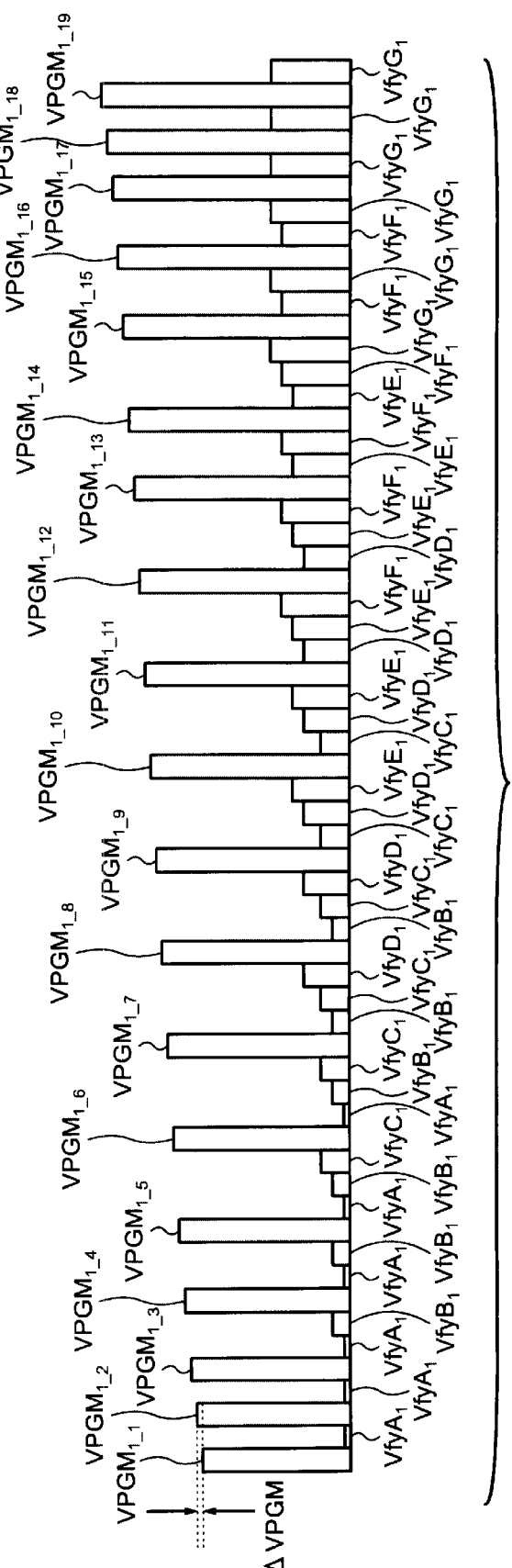
FIG. 12 is a diagram showing timings of the program operation and the verify operation in a subprogram sequence of the memory system according to the first embodiment.

An example of the write operation will be described with reference to FIGS. 11 and 12. FIG. 11 is a diagram showing a relationship between the number of program loops, and the program operation and the verify operation, in the subprogram sequence of the write operation of the semiconductor memory device 2. FIG. 12 is a diagram showing timings of the program operation and the verify operation during the write operation based on the above-described subprogram sequence and is a diagram showing a transition of a voltage of a selected word line. In addition, FIG. 12 is a diagram showing the timings of the program operation and the verify operation during the write operation of a first subprogram sequence, which will be described below, based on the prefix command and is a diagram showing the transition of the voltage of the selected word line. In the description of an example of the write operation, the description of the same or similar configuration as in FIGS. 1 to 10 may be omitted.

FIG. 11 shows an example in which the program loop is repeated 19 times (L=19) and data is written.

FIG. 11 shows a target state of the verify operation performed in each program loop. As shown in the diagram, in the first and second program loops, the verify operation is performed only for the "A" state. That is, during the verify operation, the voltage $VfyA_1$ is applied to the selected word line WL_sel, and the voltages $VfyB_1$ to $VfyG_1$ are not applied. Subsequently, in the third and fourth program loops, the verify operation is performed for the "A" state and the "B" state. That is, during the verify operation, the voltages $VfyA_1$ and $VfyB_1$ are sequentially applied to the selected word line WL_sel, and the voltages $VfyC_1$ to $VfyG_1$ are not applied.

In the fifth and sixth program loops, the verify operation is performed for the "A" state, the "B" state, and the "C" state. That is, during the verify operation, the voltages $VfyA_1$, $VfyB_1$, and $VfyC_1$ are sequentially applied to the selected word line WL_sel, and the voltages $VfyD_1$ to $VfyG_1$ are not applied. Then, when the number of fail bits for the "A" state verification is equal to or less than a predetermined number, the "A" state verify operation is completed. In FIG. 11, it is assumed that the verify operation in the "A" state is completed in the sixth loop.

In addition, in the seventh and eighth program loops, the verify operation is performed for the "B" state, the "C" state, and the "D" state. That is, during the verify operation, the voltages $VfyB_1$, $VfyC_1$, and $VfyD_1$ are sequentially applied to the selected word line WL_sel. Here, it is assumed that the verify operation for the "B" state is completed in the eighth write operation. Further, in the ninth and tenth program loops, the verify operation is performed for the "C" state, the "D" state, and the "E" state. That is, during the verify operation, the voltages $VfyC_1$, $VfyD_1$, and $VfyE_1$ are sequentially applied to the selected word line WL_sel. Here, it is assumed that the verify operation for the "C" state is completed in the tenth program loop. Thereafter, a similar process is performed up to writing of the "G" state, and it is assumed that the program loop is repeated 19 times. As described above, in each state, the verify operation is repeated until the number of fail bits is below the number of fail bits set in advance.

FIG. 12 is a diagram showing timings of the program operation and the verify operation during the write operation based on the above-described subprogram sequence. As shown in FIG. 12, in the first and second program loops, the verify operation is performed only for the "A" state. That is, the verify operation is performed once for one program operation. In the third and fourth program loops, the verify operation is performed for the "A" state and the "B" state. That is, the verify operation is performed twice for one program operation. From the fifth program loop to the twelfth program loop in which the verify operation for the "D" state is completed, the verify operation is performed three times for one program operation. Even after the twelfth program loop, the verify operation for the set predetermined state is performed for one program operation. Finally, in 19 program loops, the program operation is performed 19 times, and the verify operation is performed 42 times (S=42).

At the timing shown in FIG. 12, the program voltage VPGM of each program loop is annotated with the number of each program loop. For example, program voltages of the third and fourth program loops are a voltage $VPGM_{1\_3}$ and a voltage $VPGM_{1\_4}$. In addition, the program voltage increases by $\Delta VPGM$ between adjacent program loops. That is, for example, a difference between the voltage $VPGM_{1\_3}$ and the voltage $VPGM_{1\_4}$ is $\Delta VPGM$, and a difference between a voltage $VPGM_{1\_14}$ and a voltage $VPGM_{1\_15}$ is $\Delta VPGM$.

In the example shown in FIG. 12, it is assumed that the verify operation is performed under the assumption shown in FIG. 11. As shown in FIG. 11, it is assumed that the verify operation for the "A" state is executed six times from the first program loop to the sixth program loop. In addition, it is assumed that the verify operation for the "B" state is executed six times from the third program loop to the eighth program loop. The same applies to other states. Here, for example, there are a plurality of memory cell transistors MT to be written with the "A" state, and there are also a plurality of bit lines BL connected to such memory cell transistors MT. Therefore, strictly speaking, for example, when the number of verify fail bits for the "A" state in the fifth program loop among the memory cell transistors MT to be written with the "A" state is equal to or less than a predetermined number of fail bits, the verify operation does not need to be executed in the sixth program loop. The same applies to the examples to be described below.

The voltage VPGM that is applied to the selected word line WL_sel in the first program operation, the amount of increase in the voltage VPGM in the second and subsequent program operations, and the program loop in which the verify operation is started at each state are set in consideration of the worst case where the writing is fast, and a sufficient margin is secured such that write exceeding the target state is not performed.

The number of program loops in the write operation, the voltage (voltage VPGM) of the selected word line WL_sel in each program loop, and the verify operation target state in each program loop described above are stored in the sequencer 24 as a subprogram sequence, for example. When the write operation to the memory cell array 21 is executed based on the subprogram sequence, a control signal based on the subprogram sequence is output from the sequencer 24 to the sense amplifier module 70 and the row decoder 29.

1-2-3. Overview of Sense Amplifier Unit

Figure 13:
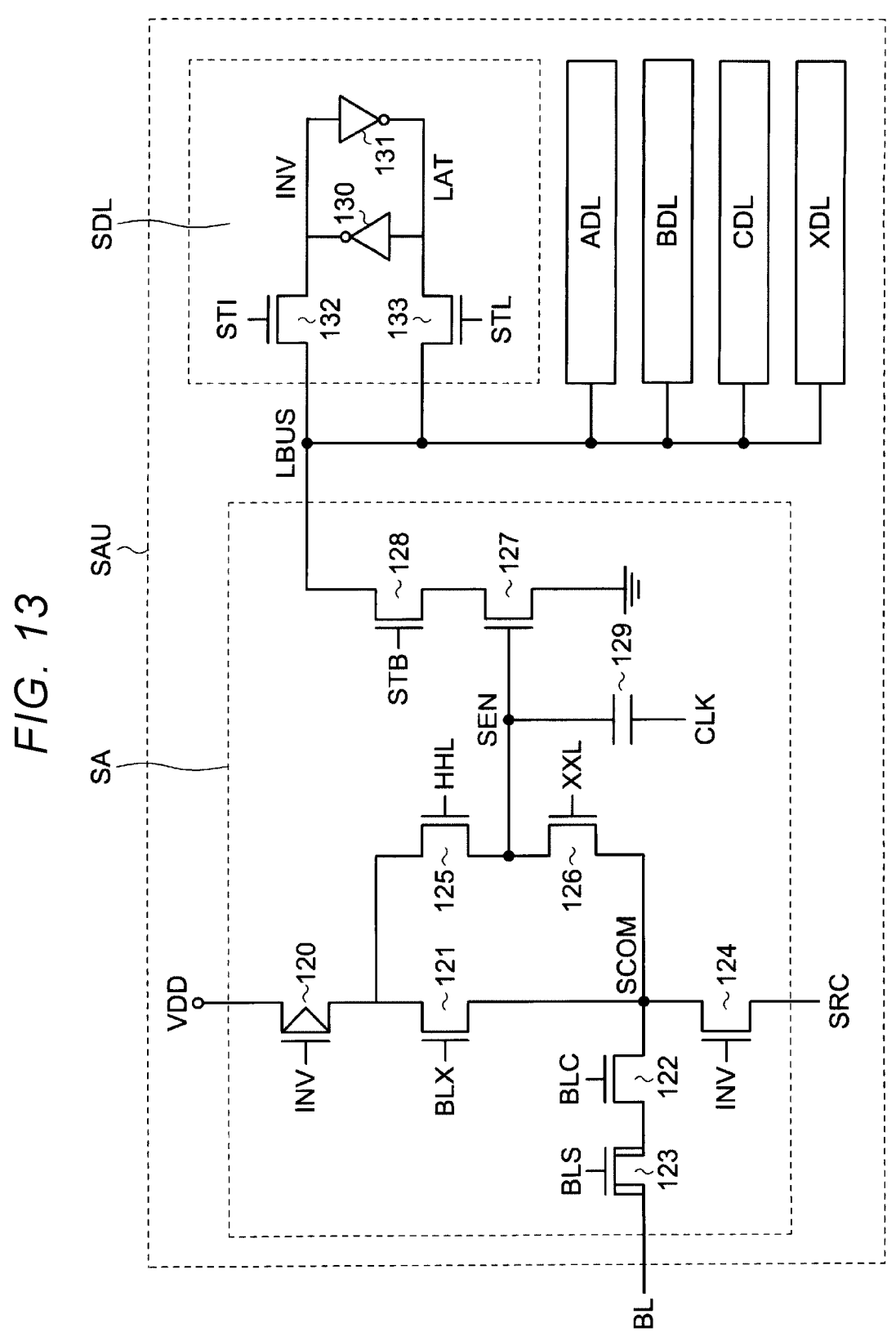
FIG. 13 is a circuit diagram showing an example of a circuit configuration of a sense amplifier unit in the first embodiment.

The sense amplifier unit will be described with reference to FIGS. 13 to 15. An example of the sense amplifier module 70 described in "1-1-2. Configuration of Memory Controller 1", "1-1-3. Configuration of Semiconductor Memory Device 2", and "1-2-1. Overview of Write Operation" will be described in detail. The sense amplifier module 70 includes a plurality of sense amplifier units SAU associated with the bit lines BL0 to BL(N−1), respectively. FIG. 13 shows an example of a circuit configuration of one sense amplifier unit SAU. FIGS. 14A to 14C show an example of the operation of one sense amplifier unit SAU. FIG. 15 shows an example of a circuit configuration of one sense amplifier unit CSAU according to a comparative example. In the description of the sense amplifier unit SAU, the description of the same or similar configuration as in FIGS. 1 to 12 may be omitted.

First, an example of one sense amplifier unit SAU will be described with reference to FIGS. 13 to 14C. As described in "1-1-3. Configuration of Semiconductor Memory Device 2", the sense amplifier unit SAU is connected to the bit line BL. The sense amplifier unit SAU includes m (m is an integer smaller than n+1) latch circuits for storing program data. For example, the sense amplifier unit SAU can store data corresponding to threshold voltages of $2^m$ levels and determine whether or not the memory cell transistor MT, which is a target of the write operation and connected to the bit line BL, is at the target threshold voltage. In addition, the data corresponding to the threshold voltage read through the corresponding bit line BL can be temporarily stored in the sense amplifier unit SAU. Further, the sense amplifier unit SAU can perform a logical operation by using temporarily stored data. That is, the sense amplifier unit SAU can manage $2^m$ levels by using the data stored in the latch circuits provided in the sense amplifier unit SAU, with respect to the corresponding bit line BL. The semiconductor memory device 2 can execute the read operation and the write operation by using the sense amplifier unit SAU.

As shown in FIG. 13, the sense amplifier unit SAU includes a sense amplifier portion SA, and latch circuits SDL, ADL, BDL, CDL, and XDL. The sense amplifier portion SA, and the latch circuits SDL, ADL, BDL, CDL, and XDL are connected by a bus LBUS such that data can be mutually exchanged. The sense amplifier portion SA is connected between a power supply line and a node SRC. The node SRC is supplied with a voltage smaller than a voltage supplied to the power supply line. The power supply line is a voltage supply line for supplying a voltage of "H" to the sense amplifier portion SA. The node SRC is a node for supplying a voltage of "L" to the sense amplifier portion SA. The sense amplifier portion SA is supplied with a voltage from the power supply line and the node SRC and operates. The power supply line and the node SRC may be configured to supply a voltage to an element other than the sense amplifier portion SA in the sense amplifier unit SAU. The voltage of "H" is, for example, a voltage VDD, and the voltage of "L" is, for example, the voltage VSS.

The sense amplifier portion SA senses voltages from the corresponding bit line BL in the read operation and determines the data stored in the memory cell transistor MT connected to the bit line BL. The sense amplifier portion SA includes, for example, a p-channel MOS transistor 120, n-channel MOS transistors 121 to 128, and a capacitor 129.

For example, during a verify operation, the sense amplifier portion SA senses the voltages and determines whether the desired threshold voltage has been reached, and the sense amplifier portion SA may determine the target data as "written" and temporarily store the result determined as "written" in the latch circuits SDL and XDL. On the other hand, when it is determined that the desired threshold voltage has not been reached, and the sense amplifier portion SA may determine the target data as "unwritten" and temporarily store the result determined as "unwritten" in the latch circuits SDL and XDL.

One end of the transistor 120 is connected to the power supply line, and the gate of the transistor 120 is connected to a node INV in the latch circuit SDL. One end of the transistor 121 is connected to the other end of the transistor 120, the other end of the transistor 121 is connected to a node SCOM, and a control signal BLX is input to the gate of the transistor 121. One end of the transistor 122 is connected to the node SCOM, and a control signal BLC is input to the gate of the transistor 122. The transistor 123 is a MOS transistor having a high breakdown voltage. One end of the transistor 123 is connected to the other end of the transistor 122, and the other end of the transistor 123 is connected to the corresponding bit line BL. A control signal BLS is input to the gate of the transistor 123.

One end of the transistor 124 is connected to the node SCOM, the other end of the transistor 124 is connected to the node SRC, and the gate of the transistor 124 is connected to the node INV. One end of the transistor 125 is connected to the other end of the transistor 120, the other end of the transistor 125 is connected to the sense node SEN, and a control signal HHL is input to the gate of the transistor 125. One end of the transistor 126 is connected to the sense node SEN, the other end of the transistor 126 is connected to the node SCOM, and a control signal XXL is input to the gate of the transistor 126.

One end of the transistor 127 is grounded, and the gate of the transistor 127 is connected to the sense node SEN. One end of the transistor 128 is connected to the other end of the transistor 127, the other end of the transistor 128 is connected to the bus LBUS, and a control signal STB is input to the gate of the transistor 128. One end of the capacitor 129 is connected to the sense node SEN, and a clock CLK is input to the other end of the capacitor 129. For example, the voltage VSS is supplied to the clock CLK.

The control signals BLX, BLC, BLS, HHL, XXL, ST1, STL, and STB are generated by, for example, the sequencer 24. Further, for example, the voltage VDD, which is an internal power supply voltage of the semiconductor memory device 2, is supplied to the power supply line that is connected to one end of the transistor 120, and for example, the voltage VSS, which is a ground voltage of the semiconductor memory device 2, is supplied to the node SRC.

As described in "1-2-1. Overview of Write Operation", in the memory system 3, the user data of 5-bit/Cell is encoded into EData of 3-bit/Cell based on the prefix command to execute the "subprogram sequence". The number of latch circuits that store program data in the sense amplifier unit SAU of the memory system 3 is three. The three latch circuits, that is, the latch circuits ADL, BDL, and CDL, are latch circuits that store program data. Each of the three latch circuits, that is, the latch circuits ADL, BDL, and CDL, can store data corresponding to threshold voltages of $2^3$ levels (8 levels, 8 values). As described in "1-2-1. Overview of Write Operation", the $2^3$ levels are levels of any state of the Er, A, B, . . . , and G states respectively corresponding to the eight threshold voltage distributions. The latch circuit SDL is, for example, a latch circuit having a function of storing a determination result, a function of storing a calculation result, a function of temporarily storing write data, and a function of temporarily storing read data DAT. The latch circuit XDL is, for example, a latch circuit connected to the register 25 and used to input and output data between the sense amplifier unit SAU and the input/output circuit 22.

The latch circuit SDL includes, for example, inverters 130 and 131, and n-channel MOS transistors 132 and 133. An input node of the inverter 130 is connected to a node LAT, and an output node of the inverter 130 is connected to a node INV. An input node of the inverter 131 is connected to the node INV, and an output node of the inverter 131 is connected to the node LAT. One end of the transistor 132 is connected to the node INV, the other end of the transistor 132 is connected to the bus LBUS, and a control signal ST1 is input to the gate of the transistor 132. One end of the transistor 133 is connected to the node LAT, the other end of the transistor 133 is connected to the bus LBUS, and a control signal STL is input to the gate of the transistor 133. For example, the data stored in the node LAT corresponds to the data stored in the latch circuit SDL, and the data stored in the node INV corresponds to inverted data of the data stored in the node LAT. Since the circuit configurations of the latch circuits ADL, BDL, CDL, and XDL are identical to, for example, the circuit configuration of the latch circuit SDL, the description thereof will be omitted.

The program voltage VPGM increases stepwise by ΔVPGM (FIG. 12) for each program operation. For example, in the memory system 3, the voltage that increases stepwise is referred to as a "step-up", and ΔVPGM is referred to as a step-up voltage.

For example, the latch circuit SDL may store a result determined as "written" before the step-up and a result determined as "unwritten" before the step-up, and a result determined as "written" after the step-up and a result determined as "unwritten" after the step-up, in the program operation and the verify operation for the memory cell transistor MT provided in a predetermined string 116 and belonging to a predetermined word line WL.

An example in which the memory controller 1 instructs the sense amplifier unit SAU to perform the verify operation of the write operation will be described with reference to FIGS. 14A to 14C. Based on the prefix command, the memory controller 1 instructs the semiconductor memory device 2 to execute a subprogram operation including the write operation and inputs, for example, EData of 3-bit/Cell ($2^3$ levels=8 values) shown in FIG. 14A to the latch circuits ADL, BDL, and CDL of the sense amplifier unit SAU. At this time, for example, 1st page data is input to the latch circuit ADL, 2nd page data is input to the latch circuit BDL, and 3rd page data is input to the latch circuit CDL.

For example, in the verify operation, when the memory system 3 executes the verify operation for the memory cell transistor MT written with the data of the "A" state, in step 1, the sense amplifier unit SAU uses the latch circuits SDL, ADL, BDL, and CDL to designate the string 116 written with the data of the "A" state. At this time, the sense amplifier unit SAU executes a logical operation (e.g., a logical OR operation) by using the data (here, "0", "1", and "1", respectively) temporarily stored in the latch circuits ADL, BDL, and CDL and writes "1" to the latch circuit SDL (FIG. 14A).

Next, the sense amplifier unit SAU reads data from the memory cell transistor MT which is to be written with the data of the "A" state. As described in "1-2-1. Overview of Write Operation", the sense amplifier unit SAU (sense amplifier portion SA) monitors the state of the sense node SEN. In step 2, the sense amplifier portion SA determines whether the threshold voltage is smaller ("0") or larger ("1") than the voltage $VfyA_1$ (FIG. 14B). When the threshold voltage is "1", for example, the latch circuit SDL stores a result (for example, "1") determined as "written" after the step-up.

The verify operation is executed for the string 116 corresponding to the "B" state to the "G" state in the same manner as in the verify operation for the "A" state. Thereafter, the sense amplifier unit SAU executes a logical operation (e.g., a logical AND operation) by using the data temporarily stored in the latch circuits ADL, BDL, CDL, XDL, and SDL. All the latch circuits in the sense amplifier unit SAU corresponding to the bit line BL including the string 116 that has passed the verify operation store the result (for example, "1") determined as "written", and are excluded from the target of the verify operation. For example, in the step 3, as shown in FIG. 14C, all the latch circuits in the sense amplifier unit SAU corresponding to the bit line BL including the string 116 that has passed the verify operation for the "A" state store the result determined as "written" (for example, "1") and are excluded from the target of the verify operation.

In the sense amplifier unit SAU, the timing at which each sense amplifier unit SAU determines the data corresponding to the threshold voltage read from the bit line BL is based on the timing at which the control signal STB is asserted. In the semiconductor memory device 2, "the sequencer 24 asserting the control signal STB" corresponds to the sequencer 24 changing the control signal STB from the "L" level to the "H" level.

The configuration of the sense amplifier unit SAU is not limited to the configuration and the function described with reference to FIGS. 13 to 14C. For example, in the sense amplifier unit SAU, the transistor 128 to which the control signal STB is input to the gate may be configured with a p-channel MOS transistor. In this case, "the sequencer 24 asserting the control signal STB" corresponds to the sequencer 24 changing the control signal STB from the "H" level to the "L" level.

Next, an example of the sense amplifier unit CSAU according to the comparative example will be described with reference to FIG. 15.

The sense amplifier unit CSAU includes two more program data latches (latch circuits) than the sense amplifier unit SAU. Since other configurations and functions are the same as those of the sense amplifier unit SAU, the description thereof will be omitted.

The sense amplifier unit CSAU includes latch circuits DDL and EDL in addition to the configuration of the sense amplifier unit SAU.

The semiconductor memory device including the sense amplifier unit CSAU according to the comparative example can execute the write operation based on the standard program sequence, but cannot execute the subprogram operation including the write operation based on the prefix command to execute the "subprogram sequence". When the user data of 5-bit/Cell is written, the required number of latch circuits that store the program data is five.

1-2-4. Area Reduction of Sense Amplifier Unit

Figure 16:
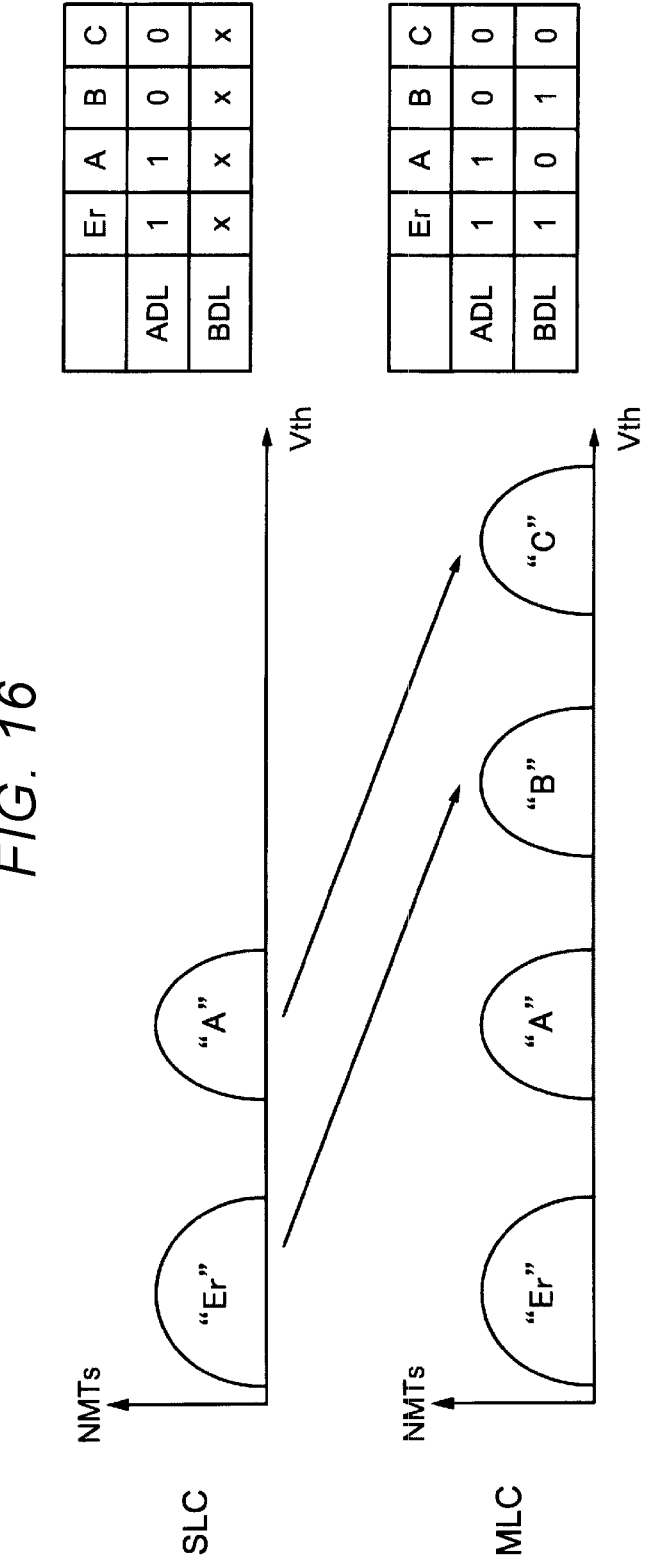
FIG. 16 is a schematic diagram showing a relationship between a threshold voltage distribution of the memory cell transistor and a data latch in the comparative example.
Figure 17:
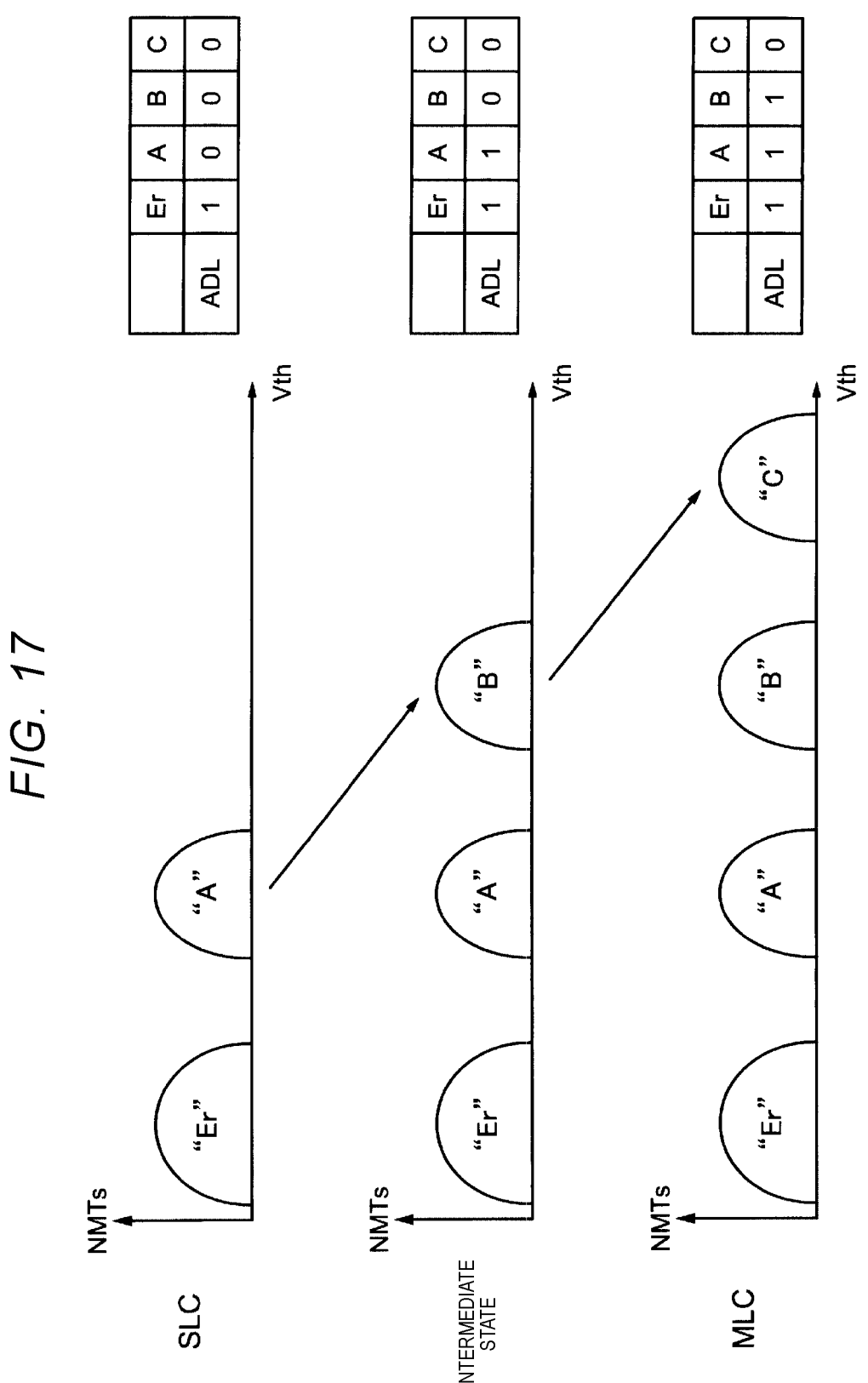
FIG. 17 is a schematic diagram showing a relationship between the threshold voltage distribution of the memory cell transistor and a data latch in the first embodiment.

The subprogram according to the first embodiment and the addition method according to the comparative example will be described with reference to FIGS. 16 and 17. FIG. 16 shows a relationship between a threshold voltage distribution of the memory cell transistor according to the comparative example and a threshold voltage corresponding to a state stored in the data latch circuit corresponding to each page, and FIG. 17 shows a relationship between the threshold voltage distribution of the memory cell transistor MT according to the first embodiment and the threshold voltage corresponding to the state stored in the data latch circuit corresponding to each page. In addition, the area of the sense amplifier unit will be described with reference to FIG. 18. FIG. 18 is a schematic diagram of the layout of the sense amplifier unit SAU. In the diagrams of the threshold voltage distributions shown in FIGS. 16 and 17, the horizontal axis and the vertical axis are the same as the horizontal axis and the vertical axis of the threshold voltage distribution shown in FIG. 5. In the description of the area reduction of the sense amplifier unit, the description of the same or similar configuration as in FIGS. 1 to 15 may be omitted.

As an example, the addition method in a case where the memory cell is the MLC and four threshold voltage distributions are formed will be described.

As shown in FIG. 16, first, in the write operation of the semiconductor memory device according to the comparative example, threshold voltage distributions for 1 bit corresponding to the "Er" state and the "A" state corresponding to an SLC are formed. The latch circuit ADL provided in the sense amplifier unit stores "1" for the "Er" state and the "A" state. Next, the threshold voltage distributions of the "B" state and the "C" state corresponding to the MLC are formed. That is, the "B" state and the "C" state are added. The latch circuit BDL provided in the sense amplifier unit stores "1" for the "Er" state and the "B" state.

Even when the state of the MLC is added, it is necessary to distinguish between four states, that is, the SLC, the "A" state, the "B" state, and the "C" state, and in order to distinguish between the four states, two pieces of data (2 bits) of data) are required. That is, in the addition method of the memory cell transistor according to the comparative example, two latch circuits are required.

Meanwhile, as shown in FIG. 17, first, in the write operation of the semiconductor memory device 2, threshold voltage distributions for 1 bit corresponding to the "Er" state and the "A" state corresponding to the SLC are formed. The latch circuit ADL provided in the sense amplifier unit SAU stores "1" for the "Er" state. Next, in the intermediate state, only 1 bit corresponding to the "B" state is added, and the latch circuit ADL stores "1" for the "A" state. Further, only 1 bit corresponding to the "C" state is added, and the latch circuit ADL stores "1" for the "B" state.

In the write operation of the semiconductor memory device 2, the threshold voltage distribution in the intermediate state is formed when the state is added. In the semiconductor memory device 2, one state is distinguished by adding only 1 bit with the formation of the intermediate state. Therefore, in the semiconductor memory device 2 capable of executing the subprogram, one latch circuit may be used even in the MLC.

Forming the intermediate state corresponds to overlaying the states. In the write operation of the semiconductor memory device 2, by forming the intermediate state, the number of latch circuits provided in each sense amplifier unit SAU can be reduced as compared with the semiconductor memory device of the comparative example.

For example, as shown in FIG. 18, in the semiconductor memory device 2, 16 sense amplifier units SAU<0> to SAU<15> are stacked and disposed. Each sense amplifier unit SAU is connected to any one of the 16 bit lines BL (16BL). For example, when the semiconductor memory device according to the comparative example and the semiconductor memory device 2 are compared, the number of necessary latch circuits to perform the write operation is reduced. More specifically, while the five latch circuits ADL to EDL are required to store 5 bits of the program data in the comparison example, for example, the three latch circuits ADL to CDL are sufficient in the embodiment. That is, two latch circuits are reduced.

1-2-5. Example of Subprogram Sequence

Figure 19A:
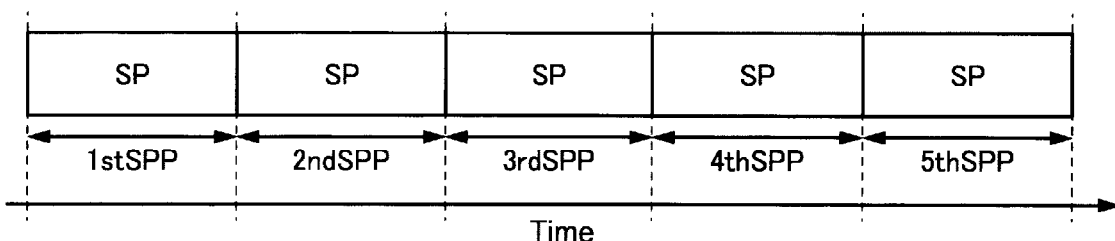
FIG. 19A is a diagram showing a timing chart of the subprogram sequence in the first embodiment.
Figure 19B:
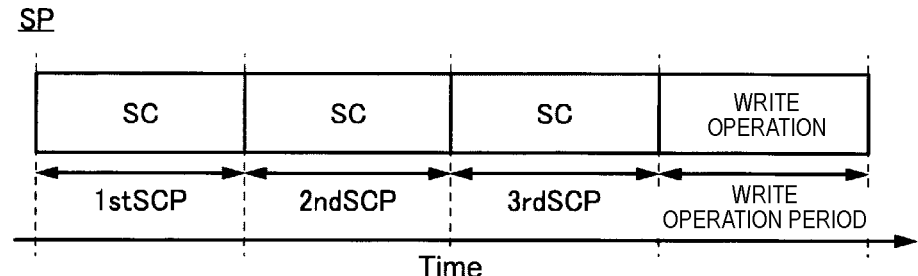
FIG. 19B is a diagram showing a timing chart of a subprogram operation in the first embodiment.
Figure 21:
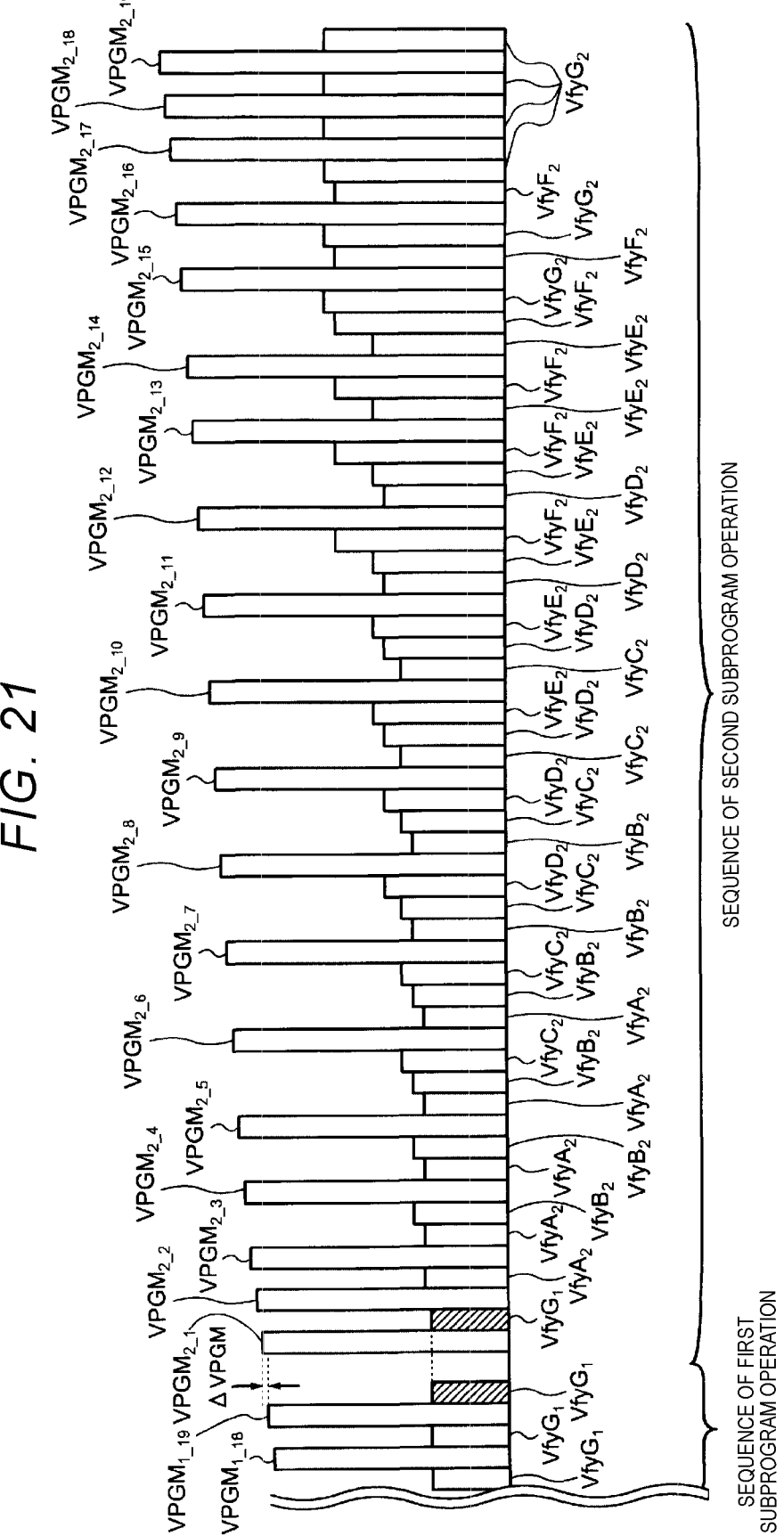
FIG. 21 is a diagram showing an example of the subprogram sequence of the memory system according to the first embodiment.

An example of the subprogram sequence will be described mainly with reference to FIGS. 11, 12, and 19A to 24. FIG. 19A is a diagram showing a timing chart of the subprogram sequence, FIG. 19B is a diagram showing a timing chart of the subprogram operation, and FIG. 20 is a diagram showing timings of the program operation and the verify operation in the subprogram sequence of the memory system 3. FIG. 21 is a diagram showing an example of the subprogram sequence of the memory system 3. FIG. 22 is a diagram showing an example of a program sequence of the semiconductor memory device according to the comparative example. FIG. 23 is a diagram showing an example of an encoded data table of the memory system 3. FIGS. 24 and 25 are diagrams showing an example of the subprogram sequence of the memory system 3. In the description of the subprogram sequence, the description of the same or similar configuration as in FIGS. 1 to 18 may be omitted.

1-2-5-1. Overview of Subprogram Sequence

As shown in FIG. 19A, the subprogram sequence includes, for example, a first subprogram operation period (1stSPP), a second subprogram operation period (2ndSPP), a third subprogram operation period (3rdSPP), a fourth subprogram operation period (4thSPP), and a fifth subprogram operation period (5thSPP). The memory system 3 executes the subprogram operation (sub program (SP)) corresponding to each period in each period.

As shown in FIG. 19B, each SP period includes, for example, a first sub-coding operation period (1stSCP), a second sub-coding operation period (2ndSCP), a third sub-coding operation period (3rdSCP), and a write operation period. The memory system 3 executes a sub-coding operation (sub coding (SC)) corresponding to each period and executes a write operation based on the 1stSCP to the 3rdSCP in the write operation period.

Figure 19C:
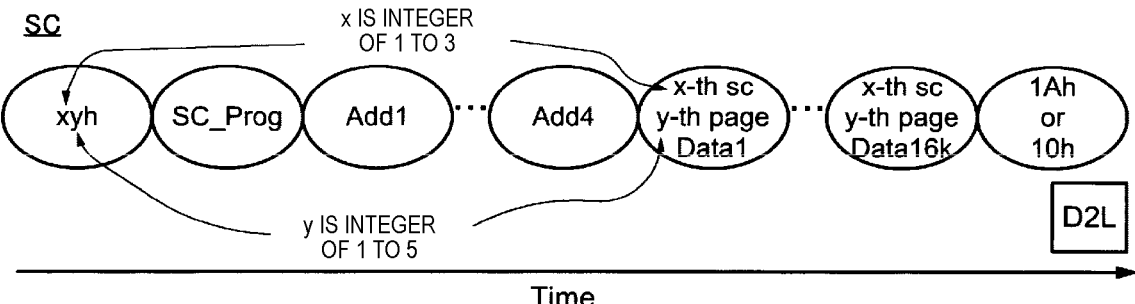
FIG. 19C is a diagram showing a timing chart of the subprogram sequence in the first embodiment.
Figure 19D:
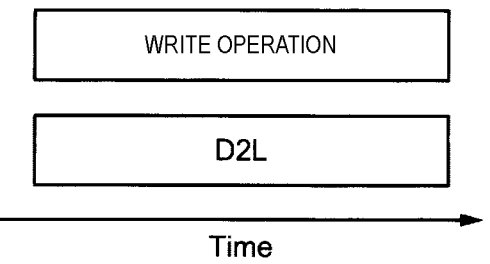
FIG. 19D is a diagram showing a timing chart of the subprogram operation in the first embodiment.

As shown in FIG. 19C, the memory system 3 executes the sub-coding operation based on a command sequence "xyh-SC_prog-Add1 to Add4-xth SC yth pageData1 to xth SC yth pageData16k-1Ah (or 10h)" in each SP period.

The memory controller 1 transmits the command "xyh", the command "SC_prog", and the command "1 Ah" to the semiconductor memory device 2. The command "xyh" is the prefix command to execute the "subprogram sequence". Here, the numerical value x is an index indicating the order of the sub-coding operation and is an integer of 1 to 5. In addition, the numerical value y is an index indicating the page number of the write data and is an integer of 1 to 3. For example, "11h" is a command indicating that this operation is a first sub-coding operation, the write data is data of the first page, and the like. The command "SC_prog" is a command for executing a subprogram designated by the prefix command. For example, the semiconductor memory device 2 that executes the xth sub-coding operation recognizes that the subsequent write data is data of the yth page when the continuous commands "xyh" and "SC_Prog" are received.

Subsequently, the memory controller 1 transmits the addresses Add1 to Add4 to the semiconductor memory device 2, for example, in four cycles. The addresses Add1 to Add4 are physical addresses to which write data is written. Subsequently, the memory controller 1 transmits write data (xth SC yth pageData1 to xth SC yth pageData16k), which is data of the yth page of the xth sub-coding operation, to the semiconductor memory device 2.

Subsequently, the memory controller 1 transmits the transfer command "1Ah" or "10h" to the semiconductor memory device 2.

The transfer command "1Ah" is, for example, a command for issuing a command to transfer the write data transmitted immediately before to any of the latch circuits ADL, BDL, and CDL. For example, while the memory controller 1 transmits the transfer command "1Ah" to the semiconductor memory device 2, upon receiving the transfer command "1Ah", the semiconductor memory device 2 transmits the write data designated by xth SC yth pageData1 to xth SC yth pageData16k to the latch circuit ADL, and the latch circuit ADL stores the write data (a D2L process of FIG. 19C).

The transfer command "10h" is, for example, a command for issuing a command to transfer the write data transmitted immediately before to any of the latch circuits ADL, BDL, and CDL, and is also a command to execute the write operation of the write data transferred based on the transfer command "1Ah" before the transfer command "10h" is transmitted and the write data transferred based on the transfer command "10h". For example, when the memory controller 1 transmits the transfer command "10h" to the semiconductor memory device 2, upon receiving the transfer command "10h", the semiconductor memory device 2 transmits the write data designated by xth SC yth pageData1 to xth SC yth pageData16k to the latch circuit ADL, and the latch circuit ADL stores the write data (the D2L process of FIG. 19C). In addition, the semiconductor memory device 2 executes the write operation when receiving the transfer command "10h". Upon receiving the transfer command "10h", the semiconductor memory device 2, in parallel with executing the write operation, transmits the write data designated based on the transfer command "1Ah" before the transfer command "10h" is transmitted, and the write data designated based on the transfer command "10h" to the latch circuit ADL, BDL, and CDL, and each latch circuit may store the write data (the D2L process of FIG. 19D).

1-2-5-2. Timing of Subprogram Sequence

Based on FIGS. 19A to 19D, the memory system 3 executes the subprogram sequence shown in FIG. 20.

For example, as shown in FIG. 20, the memory system 3, in the 1stSPP, executes the first sub-coding operation of the first page (1st page) in the 1stSCP based on "11h-SC_prog-Add1 to Add4-1st SC 1st pageData1 to 1st SC 1st pageData16k-1Ah", executes the first sub-coding operation of the second page (2nd page) in the 2ndSCP based on "12h-SC_prog-Add1 to Add4-1st SC 2nd pageData1 to 1st SC 2nd pageData16k-1Ah", executes the first sub-coding operation of the third page (3rd page) in the 3rdSCP based on "13h-SC_prog-Add1 to Add4-1st SC 3rd pageData1 to 1st SC 3rd pageData16k-10h", and executes the write operation in the 1stSPP.

Although not shown, the memory system 3, in the 2ndSPP following the 1stSPP, executes a second sub-coding operation of the first page (1st page) in the 1stSCP based on "21h-SC_prog-Add1 to Add4-2nd SC 1st pageData1 to 2nd SC 1st pageData16k-1Ah", executes the second sub-coding operation of the second page (2nd page) in the 2ndSCP based on "22h-SC_prog-Add1 to Add4-2nd SC 2nd pageData1 to 2nd SC 2nd pageData16k-1Ah", executes the second sub-coding operation of the third page (3rd page) in the 3rdSCP based on "23h-SC_prog-Add1 to Add4-3rd SC 3rd pageData1 to 3rd SC 3rd pageData16k-10h", and executes the write operation in the 2ndSPP.

In addition, although not shown, in the same manner as in the 2ndSPP, the memory system 3, in the 3rdSPP following the 2ndSPP, executes a third sub-coding operation of the first page (1st page) in the 1stSCP based on "31h-SC_prog-Add1 to Add4-3rd SC 1st pageData1 to 3rd SC 1st pageData16k-1Ah", executes the third sub-coding operation of the second page (2nd page) in the 2ndSCP based on "32h-SC_prog-Add1 to Add4-3rd SC 2nd pageData1 to 3rd SC 2nd pageData16k-1Ah", executes the third sub-coding operation of the third page (3rd page) in the 3rdSCP based on "33h-SC_prog-Add1 to Add4-3rd SC 3rd pageData1 to 3rd SC 3rd pageData16k-10h", and executes the write operation in the 3rdSPP.

Furthermore, although not shown, in the same manner as in the 3rdSPP, the memory system 3, in the 4thSPP following the 3rdSPP, executes a fourth sub-coding operation of the first page (1st page) in the 1stSCP based on "41h-SC_prog-Add1 to Add4-4th SC 1st pageData1 to 4th SC 1st pageData16k-1Ah", executes the fourth sub-coding operation of the second page (2nd page) in the 2ndSCP based on "42h-SC_prog-Add1 to Add4-4th SC 2nd pageData1 to 4th SC 2nd pageData16k-1Ah", executes the fourth sub-coding operation of the third page (3rd page) in the 3rdSCP based on "43h-SC_prog-Add1 to Add4-4th SC 3rd pageData1 to 4th SC 3rd pageData16k-10h", and executes the write operation in the 4thSPP.

Furthermore, as shown in FIG. 20, in the same manner as in the 4thSPP, the memory system 3, in the 5thSPP following the 4thSPP, executes a fifth sub-coding operation of the first page (1st page) in the 1stSCP based on "51h-SC_prog-Add1 to Add4-5th SC 1st pageData1 to 5th SC 1st pageData16k-1Ah", executes the fifth sub-coding operation of the second page (2nd page) in the 2ndSCP based on "52h-SC_prog-Add1 to Add4-5th SC 2nd pageData1 to 5th SC 2nd pageData16k-1Ah", executes the fifth sub-coding operation of the third page (3rd page) in the 3rdSCP based on "53h-SC_prog-Add1 to Add4-5th SC 3rd pageData1 to 5th SC 3rd pageData16k-10h", and executes the write operation in the 5thSPP.

An example of the program sequence of the memory system according to the comparative example will be described with reference to FIG. 22. The memory system according to the comparative example executes the write operation with the command "Prog" for executing the standard program sequence, by using the first page to the fifth page (to which the prefix commands (01h to 05h) correspond). Since the configurations of the addresses Add1 to Add4 and the configurations of the transfer commands 1Ah and 10h are the same, and the configurations of the data (zth pageData1 to zth pageData16k) are similar, the description thereof will be omitted here.

1-2-5-3. Example of Encoded Data of Memory System 3

An example of write data (encoded data (EData)) when the memory system 3 executes the write operation by using the subprogram sequence will be described with reference to FIG. 23.

Even when the memory system 3 executes the write operation by using the subprogram sequence, the memory system 3 can form the same 32 (levels of S0 to S31) threshold voltage distributions as the PLC by repeating the write operation of Edata including the eight different threshold voltage distributions such as the TLC to the semiconductor memory device 2 as the five subprogram operations, that is, the 1stSPP to the 5thSPP, of the subprogram sequence.

Each level of S0 to S31 corresponds to any of mutually different levels, that is, "1" to "32", shown in FIG. 23.

The memory system 3 forms the 32 threshold voltage distributions (levels of S0 to S31) by forming the levels "1" to "32" through the execution of the five subprogram operations such that seven threshold voltage levels are sequentially formed from "1".

Specifically, the memory system 3 executes the 1stSC to the 3rdSC of the 1stSPP by using EData including eight threshold voltage distributions, that is, "1" to "8", shown in 1st SC of FIG. 23, executes the 1stSC to the 3rdSC of the 2ndSPP by using EData including eight threshold voltage distributions, that is, "8" to "15", shown in 2nd SC of FIG. 23, executes the 1stSC to the 3rdSC of the 3rdSPP by using EData including eight threshold voltage distributions, that is, "15" to "22", shown in 3rd SC of FIG. 23, executes the 1stSC to the 3rdSC of the 4thSPP by using EData including eight threshold voltage distributions, that is, "22" to "29", shown in 4th SC of FIG. 23, and executes the 1stSC to the 3rdSC of the 5thSPP by using EData including four threshold voltage distributions, that is, "29" to "32", shown in 5th SC of FIG. 23.

At this time, the memory system 3 instructs the semiconductor memory device 2 to perform the write operation such that a write operation in which data "000" of the "8" level corresponding to the most significant level of the 1stSPP overlaps data "111" of the "8" level corresponding to the least significant level of the 2ndSPP is executed. Similarly, the memory system 3 instructs the semiconductor memory device 2 to perform the write operation such that a write operation in which data "000" of the "15" level corresponding to the most significant level of the 2ndSPP overlaps data "111" of the "15" level corresponding to the least significant level of the 3rdSPP is executed. Similarly, the memory system 3 instructs the semiconductor memory device 2 to perform the write operation such that a write operation in which data corresponding to the most significant level of the 3rdSPP overlaps data corresponding to the least significant level of the 4thSPP, and data corresponding to the most significant level of the 4thSPP overlaps data corresponding to the least significant level of the 5thSPP is executed.

In addition, the memory system 3 executes the write operation, stores "0" in the data of "unwritten" as shown in FIG. 23, and stores "1" in the data of "written" as shown in FIG. 23.

When all pieces of the data are "written", it means that the write operation has ended. Therefore, the memory system 3 can read the read data corresponding to the 32 levels of the first page to the fifth page from the semiconductor memory device 2 by executing the read operation after the write operation has ended.

The encoded data table shown in FIG. 23 is stored in both the memory controller 1 and the semiconductor memory device 2, and the data is shared. As a result, the memory controller 1 and the semiconductor memory device 2 can understand which data is the written encoded data and the read encoded data. Since the memory system 3 can store the encoded data table in both the memory controller 1 and the semiconductor memory device 2, and the encoded data can be checked by both, the memory system 3 can control the memory controller 1 and the semiconductor memory device 2 to execute the subprogram sequence.

A portion where data corresponding to the most significant level of jth (j is a positive integer) SPP overlaps data corresponding to the least significant level of j+1th SPP corresponds to the intermediate state described in "1-2-4. Area Reduction of Sense Amplifier Unit". By forming the intermediate state, the memory system 3 can reduce the number of latch circuits provided in each sense amplifier unit SAU as compared with the comparative example.

1-2-5-4. Modification Example of Subprogram Sequence

A modification example of the subprogram sequence will be described with reference to FIG. 24. The configuration of the modification example of the subprogram sequence using FIG. 24 is substantially the same as the configuration of the subprogram sequence shown in FIG. 20. In the description of the modification example of the subprogram sequence using FIG. 24, points different from the subprogram sequence shown in FIG. 20 will be mainly described.

The modification example shown in FIG. 24 is different in that the prefix command "xyh" shown in FIG. 20 is divided into a first prefix command and a second prefix command. The first prefix command is an index (01h to 05h) indicating the order of the sub-coding operations, and 01h to 05h indicate the first to fifth sub-coding operations, respectively. The second prefix command is an index (01h to 03h) indicating the page number of the write data, and 01h to 03h indicate the first to third pages, respectively.

As described above, in the memory system 3, it is also possible to execute the subprogram by separating the prefix command in which the order of the sub-coding operation and the page number are combined into the first prefix command indicating the order of the sub-coding operation and the second prefix command indicating the page number.

Second Embodiment

In the second embodiment, an example of encoded data different from "1-2-5-3. Example of Encoded data of Memory System 3" will be described with reference to FIG. 25.

The configuration of the encoded data shown in FIG. 25 is substantially the same as the configuration of the encoded data shown in FIG. 23. In the description of the configuration of the encoded data shown in FIG. 25, points different from the configuration of the encoded data shown in FIG. 23 will be mainly described.

The memory system 3 instructs the semiconductor memory device 2 to perform the write operation such that a write operation in which, for example, data of upper three levels of the 1stSPP and data of lower three levels of the 2ndSPP overlap each other is executed.

Specifically, the memory system 3 instructs the semiconductor memory device 2 to perform the write operation such that a write operation in which data "011" of the "6" level of the 1stSPP and data "111" of the "6" level of the 2ndSPP, data "001" of the "7" level of the 1stSPP and data "101" of the "7" level of the 2ndSPP, and data "000" of the "8" level of the 1stSPP and data "100" of the "8" level of the 2ndSPP overlap each other is executed.

A state in which the data of the 1stSPP and the data of the 2ndSPP overlap each other corresponds to the intermediate state described in "1-2-4. Area Reduction of Sense Amplifier Unit".

The "6" level is a level where the verify operation is started earlier than the "8" level. By forming the intermediate state in an early time period in the sequence and executing the verify operation, the distribution of the threshold voltage can be formed more narrowly.

Third Embodiment

Figure 26:
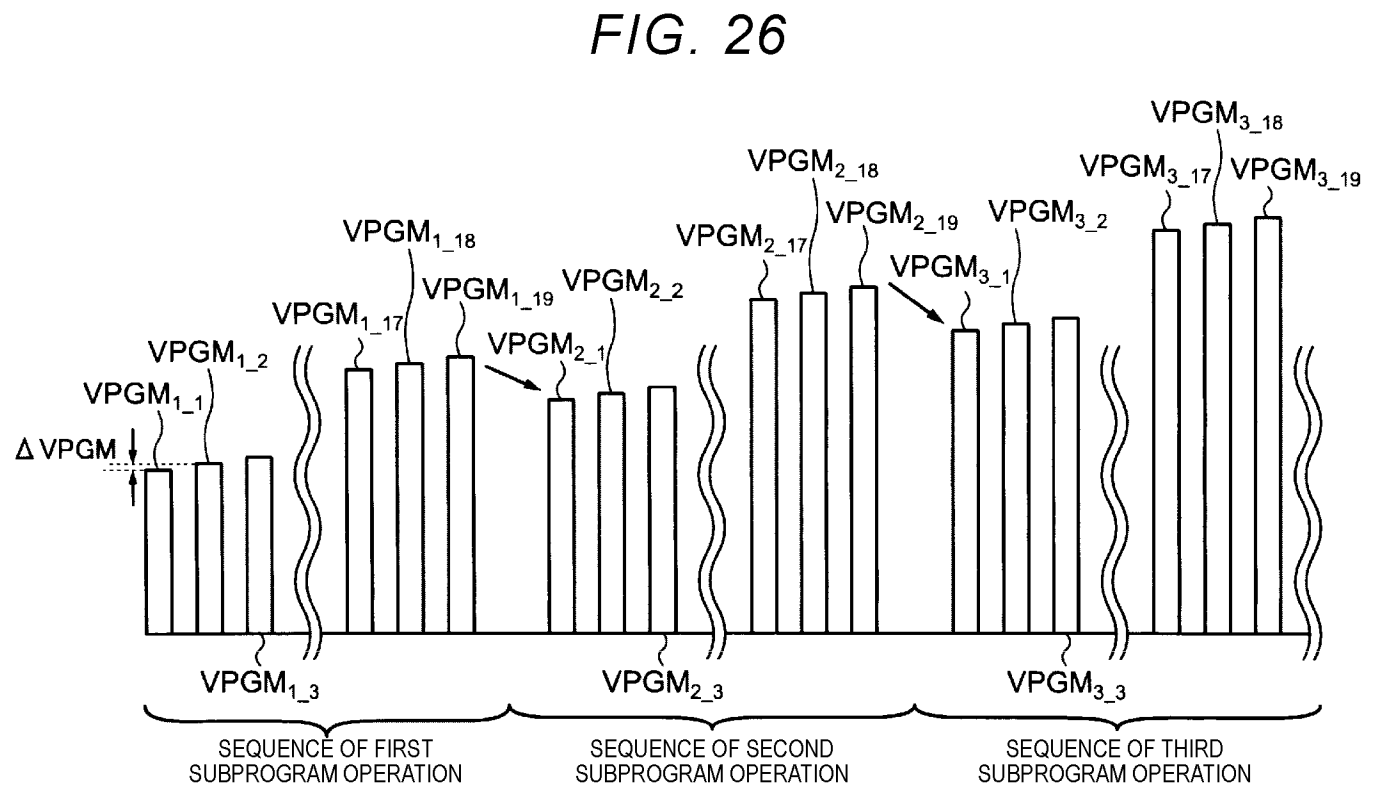

In the third embodiment, a timing of a program operation different from "1-2-5-2. Timing of Subprogram Sequence" will be described with reference to FIG. 26. FIG. 26 is a diagram showing the timing of the program operation during the write operation based on the subprogram sequence, and is a diagram showing the transition of the voltage of the selected word line. The sequence shown in FIG. 26 is substantially the same as the sequence shown in FIG. 21. In the description of the sequence of FIG. 26, the points different from the sequence shown in FIG. 21 will be mainly described.

In FIG. 26, the voltage $VfyA_1$ to the voltage $VfyG_1$ related to the verify operation in the diagram shown in FIG. 12 and the voltage $VfyA_2$ to the voltage $VfyG_2$ related to the verify operation in the diagram shown in FIG. 21 are omitted. In addition, in the second subprogram operation period (2ndSPP) shown in FIG. 26, the memory system 3 executes the program operation to supply the voltage $VPGM_{2-1}$ to the voltage $VPGM_{2-19}$ respectively corresponding to the voltages $VPGM_{1-1}$ to $VPGM_{1-19}$ in the first subprogram operation period (1stSPP). The voltage $VPGM_{2-1}$ to the voltage $VPGM_{2-19}$ are voltages obtained by boosting the corresponding voltages $VPGM_{1-1}$ to $VPGM_{1-19}$. In addition, in the third subprogram operation period (3rdSPP) shown in FIG. 26, the memory system 3 executes the program operation to supply the voltage $VPGM_{3-1}$ to the voltage $VPGM_{3-19}$ respectively corresponding to the voltage $VPGM_{2-1}$ to the voltage $VPGM_{2-19}$ in 2ndSPP. The voltage $VPGM_{3-1}$ to the voltage $VPGM_{3-19}$ are voltages obtained by boosting the corresponding voltages $VPGM_{2-1}$ to $VPGM_{2-19}$. Further, in the 3rdSPP shown in FIG. 26, in the same manner as in the verify operation in the diagram shown in FIG. 12 and the verify operation in the diagram shown in FIG. 21, the verify operation is executed to supply the voltage $VfyA_3$ to the voltage $VfyG_3$ respectively corresponding to the voltage $VfyA_2$ to the voltage $VfyG_2$ in the 2ndSPP, but the voltage $VfyA_3$ to the voltage $VfyG_3$ are omitted. The memory system 3 also executes the verify operation to supply the voltage that is boosted as the 1stSPP, the 2ndSPP, and 3rdSPP are executed, in the voltages $VfyA_1$ to $VfyG_1$ related to the verify operation, in the same manner in the voltages in the program operation.

In addition, the voltage $VPGM_{2-1}$ in the first program loop of the 2ndSPP is smaller than the voltage $VPGM_{1-19}$ in the last program loop of the 1stSPP, and the voltage $VPGM_{3-1}$ in the first program loop of the 3rdSPP is smaller than the voltage $VPGM_{2-19}$ in the last program loop of the 2ndSPP.

That is, each time the subprogram operation period changes, the memory system 3 according to the third embodiment executes the write operation to lower the program voltage in the first program loop in the subprogram operation period, as compared with the program voltage in the last program loop in the preceding subprogram operation period.

In each of the above embodiments, when using the notation "same" and "identical", it may include a case where an error within the range of design is included.

While several embodiments of the nonvolatile semiconductor memory device of the present disclosure have been described above, these embodiments have been presented by way of examples and are not intended to limit the scope of the disclosure. These novel embodiments may be implemented in various other forms and may be implemented by being combined as appropriate without departing from the gist of the disclosure, and various omissions, replacements, and modifications may be made. These embodiments and the modifications thereof are included in the scope and gist of the disclosure and are included in the scope of the disclosure described in the claims and equivalents thereof.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
i bit lines;
i memory cells that are respectively and electrically connected to the i bit lines;
a word line commonly connected to gates of the i memory cells;
sense amplifier units that are respectively and electrically connected to the i bit lines, and each of which includes m latch circuits; and
a logic control circuit configured to input data to the m latch circuits and control a write operation including a program operation and a verify operation on each of the i memory cells using the data input to the m latch circuits, wherein
the logic control circuit executes an operation to write n bits to each of the i memory cells by executing the write operation x times, where n is 2 or more and greater than m and x is 2 or more, and
the x write operations include a first write operation executed by inputting first m bits of data to the m latch circuits, and a second write operation executed after the first write operation and by inputting second m bits of data different from the first m bits of data to the m latch circuits.

2. The semiconductor memory device according to claim 1, wherein the logic control circuit:
executes the program operation L times or less in each of the first write operation and the second write operation,
in the first write operation, executes the verify operation for a part of $(2^m-1)$ verify levels corresponding to the first m bits of data, and
in the second write operation, executes the verify operation for a remaining part of the $(2^m-1)$ verify levels corresponding to the second m bits of data.

3. The semiconductor memory device according to claim 1, wherein the logic control circuit
supplies a first voltage in the verify operation for at least one memory cell among the i memory cells during the first write operation, and
supplies a second voltage, which is higher than the first voltage, in the verify operation for the at least one memory cell among the i memory cells during the second write operation.

4. The semiconductor memory device according to claim 1, wherein the logic control circuit is configured to execute the first write operation in response to a first command.

5. The semiconductor memory device according to claim 1, wherein the logic control circuit is configured to execute the first write operation in response to a first command and one or more second commands, each of which designates a page address and page data to be stored in the memory cells.

6. The semiconductor memory device according to claim 1, wherein
in each of the first write operation and the second write operation, the program operation is executed L times or less, and
the logic control circuit, during the first write operation, supplies a first program voltage to a memory cell, which is a target of the program operation, in an (L−1)-th program operation, and
supplies a second program voltage larger than the first program voltage to a memory cell, which is a target of the program operation, in an L-th program operation.

7. The semiconductor memory device according to claim 1, wherein
in each of the first write operation and the second write operation, the program operation is executed L times or less,
the logic control circuit, during the first write operation, supplies a first program voltage to a memory cell, which is a target of the program operation, in a first program operation, and
the logic control circuit, during the second write operation, supplies a second program voltage larger than the first program voltage to a memory cell, which is a target of the program operation, in a first program operation.

8. The semiconductor memory device according to claim 1, wherein the logic control circuit is further configured to perform a read operation after consecutive execution of the first write operation and the second write operation.

9. A method of writing n bits of data in each of a plurality of memory cells of a semiconductor memory device having a word line connected to gates of the memory cells, a plurality of bit lines respectively connected to the plurality of memory cells, and a plurality of sense amplifier units respectively connected to the bit lines, said method comprising the steps of:

(a) inputting m bits of data respectively to m data latches in each of the sense amplifier units, where n is 2 or more and greater than m, and executing multiple loops of first program operation and first verify operation for each of the memory cells, wherein the first verify operation is performed to verify whether or not the m bits of data inputted into the m data latches of the sense amplifier unit corresponding to the memory cell being programmed have been programmed in the memory cell; and (b) inputting a second m bits of data respectively to the m data latches in each of the sense amplifier units, and executing multiple loops of second program operation and second verify operation, wherein the second verify operation is performed to verify whether or not the second m bits of data inputted into the m data latches of the sense amplifier unit corresponding to the memory cell being programmed have been programmed in the memory cell.

10. The method according to claim 9, wherein step (a) is executed in response to a first command and one or more second commands received from the memory controller, and the second commands designate m page addresses and m pages of data to be stored in the memory cells, and step (b) is executed in response to a third command and one or more fourth commands received from the memory controller, and the fourth commands designate m page addresses and m pages of data to be stored in the memory cells.

11. The method according to claim 10, wherein in step (a), values of the m bits of data respectively input to the m data latches in each of the sense amplifier units are determined from values in the m pages of data designated by the second commands, and in step (b), values of the m bits of data respectively input to the m data latches in each of the sense amplifier units are determined from values in the m pages of data designated by the fourth commands.

* * * * *